(12) United States Patent
Miller et al.

(10) Patent No.: US 6,611,215 B2
(45) Date of Patent: Aug. 26, 2003

(54) SYSTEM AND RELATED METHODS FOR PROCESSING AUDIO CONTENT IN A FILTER GRAPH

(75) Inventors: Daniel J. Miller, Carnation, WA (US); Eric H. Rudolph, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 287 days.

(21) Appl. No.: 09/732,090

(22) Filed: Dec. 6, 2000

(65) Prior Publication Data

US 2002/0111980 A1 Aug. 15, 2002

(51) Int. Cl.$^7$ ................................................ H03M 7/00
(52) U.S. Cl. ....................... 341/61; 341/50; 341/123; 341/136; 370/352; 348/489; 709/231; 708/313
(58) Field of Search ................................ 709/231, 236; 370/352; 348/489; 360/48, 51; 708/497; 341/61, 50, 123, 143, 136

(56) References Cited

U.S. PATENT DOCUMENTS

| | | | | | |
|---|---|---|---|---|---|
| 5,327,227 | A | * | 7/1994 | Han | 348/489 |
| 5,400,187 | A | * | 3/1995 | Van Gestel | 360/48 |
| 5,913,038 | A | * | 6/1999 | Griffiths | 709/231 |
| 6,396,421 | B1 | * | 5/2002 | Bland | 341/61 |
| 6,411,225 | B1 | * | 6/2002 | Van Den Enden et al. | 341/61 |
| 6,462,682 | B2 | * | 10/2002 | Hellberg | 341/61 |
| 6,512,468 | B1 | * | 1/2003 | Zhong | 341/61 |
| 6,518,894 | B2 | * | 2/2003 | Freidhof | 341/61 |

* cited by examiner

*Primary Examiner*—Michael Tokar
*Assistant Examiner*—Lam T. Mai
(74) *Attorney, Agent, or Firm*—Lee & Hayes, PLLC

(57) ABSTRACT

A method comprising identifying a sample rate of received audio content, receiving a conversion sample rate, and converting the received audio content to the received conversion sample rate. Wherein the conversion comprises utilizing a repeating sequence of packets where all but one of the packets of each sequence are truncated to a whole number of samples, while the remaining packet is rounded up to the next whole number of samples if the conversion fails to resolve packet size to a whole number.

23 Claims, 22 Drawing Sheets

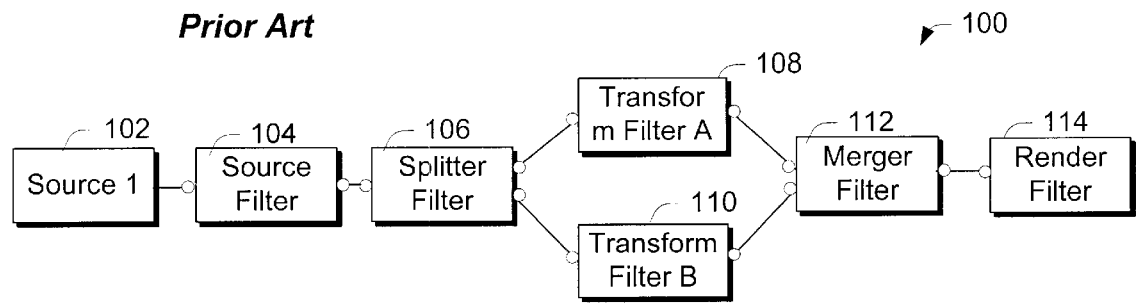
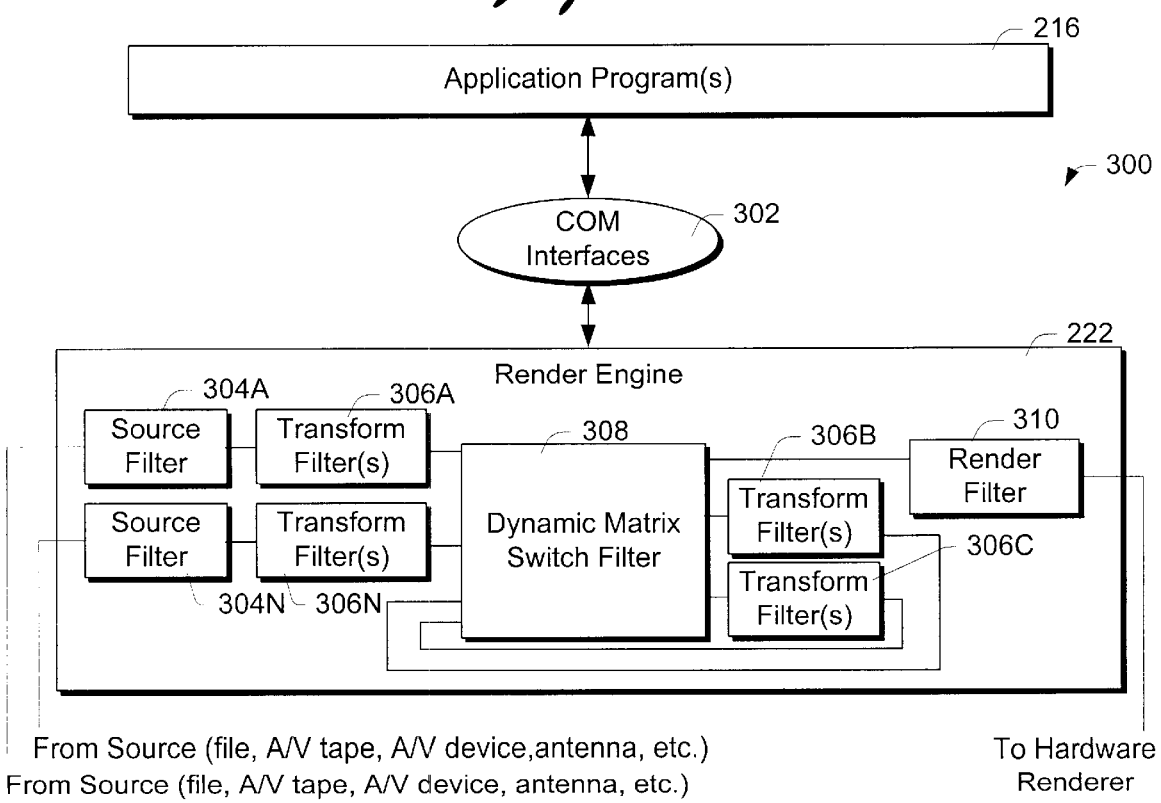

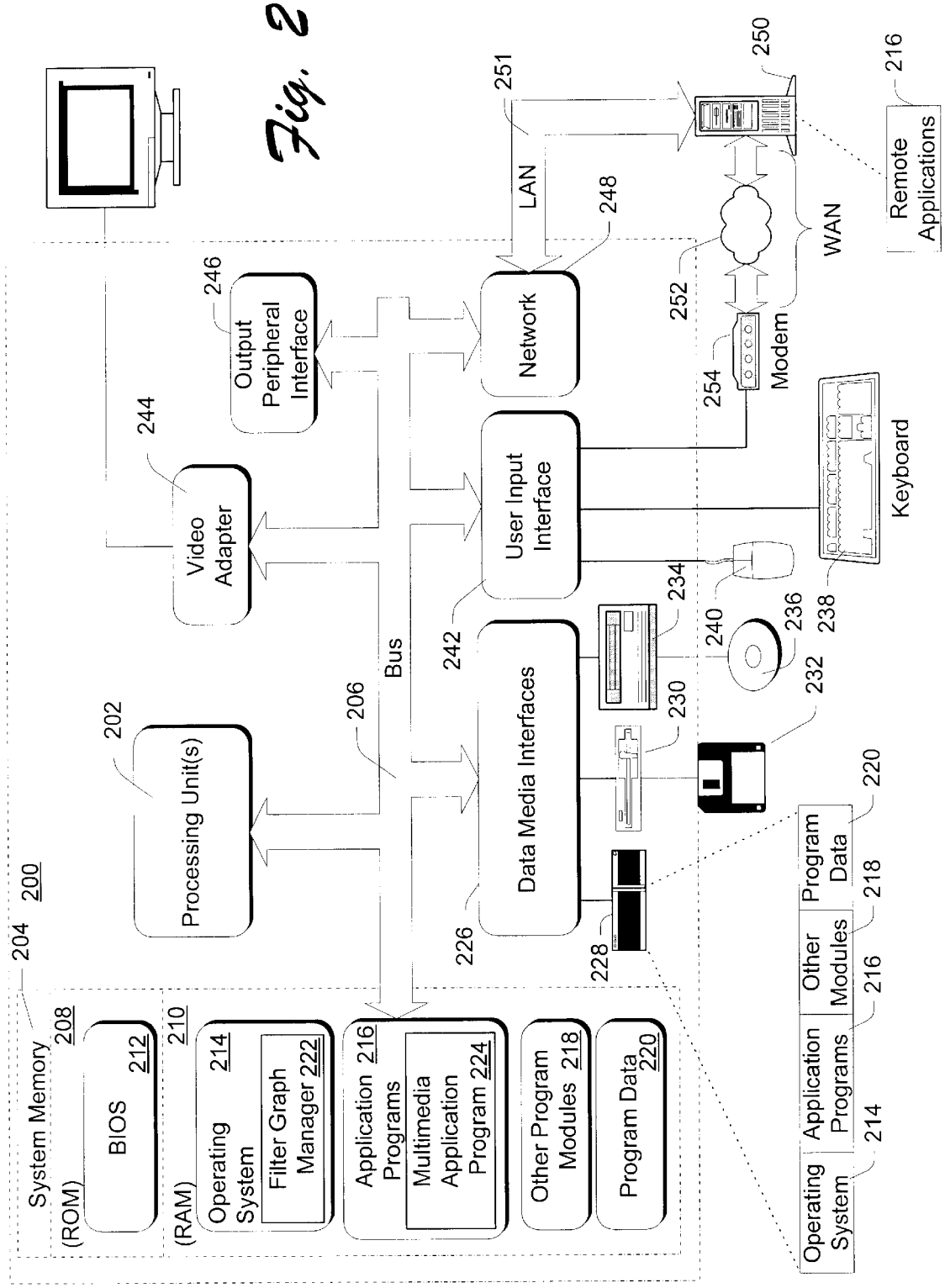

1300

|   | 0 | 2 | 4 | 6 | 8 | 10 | 12 | 14 | 16 |
|---|---|---|---|---|---|----|----|----|----|
| A |   |   | 0 |   |   |    |    |    |    |
| B |   |   |   | 0 |   |    | [0] 1 |   |   |
| C |   |   |   |   |   |    | [0] 2 | 0 |   |
| Trans |   |   |   |   |   |    | 0  |    |    |

|   | 0 | 2 | 4 | 6 | 8 | 10 | 12 | 14 | 16 |
|---|---|---|---|---|---|----|----|----|----|
| (0) A | 0 |   |   |   |   |    |    |    |    |
| (1) B |   |   |   | 0 |   |    | [0] 1 |   |   |
| (2) C |   |   |   |   |   |    | [0] 2 | 0 |   |
| (3) Trans |   |   |   |   |   |    | 0  |    |    |

|   | 0 | 2 | 4 | 6 | 8 | 10 | 12 | 14 | 16 |
|---|---|---|---|---|---|----|----|----|----|
| A |   | 0 |   |   |   |    |    |    |    |
| B |   |   |   |   | [0] 1 |  |    |    |    |
| Fx |  |   |   |   | 0 |    |    |    |    |

2200

|     | 0 | 2 | 4 | 6 | 8 | 10 | 12 | 14 | 16 |
|-----|---|---|---|---|---|----|----|----|----|
| (0) A | | 0 |  |   |   |    |    |    |    |
| (1) B |   |   |   |   | [0] 1 |  |    |    |
| (2) Fx |  |  |   |   | 0 |    | [0] 2 |  |    |
| (3) C  |  |  |   |   |   |    | [0] 3 | 0 |    |
| (4) T  |  |  |   |   |   |    | 0 |    |    |

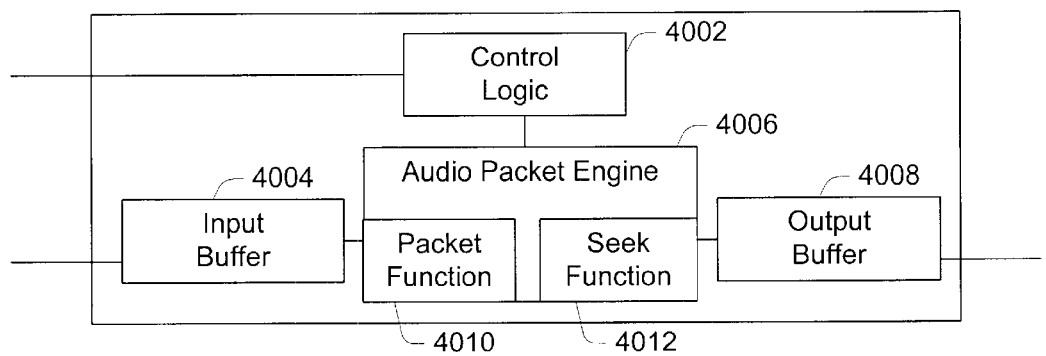
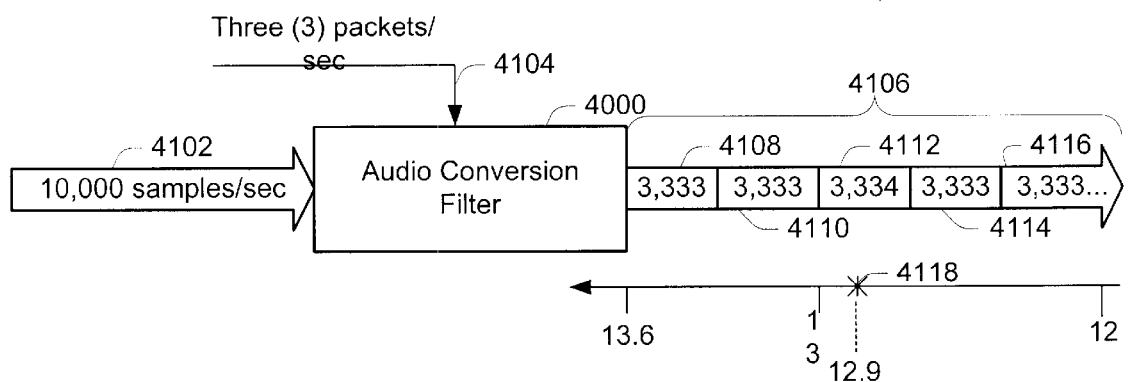

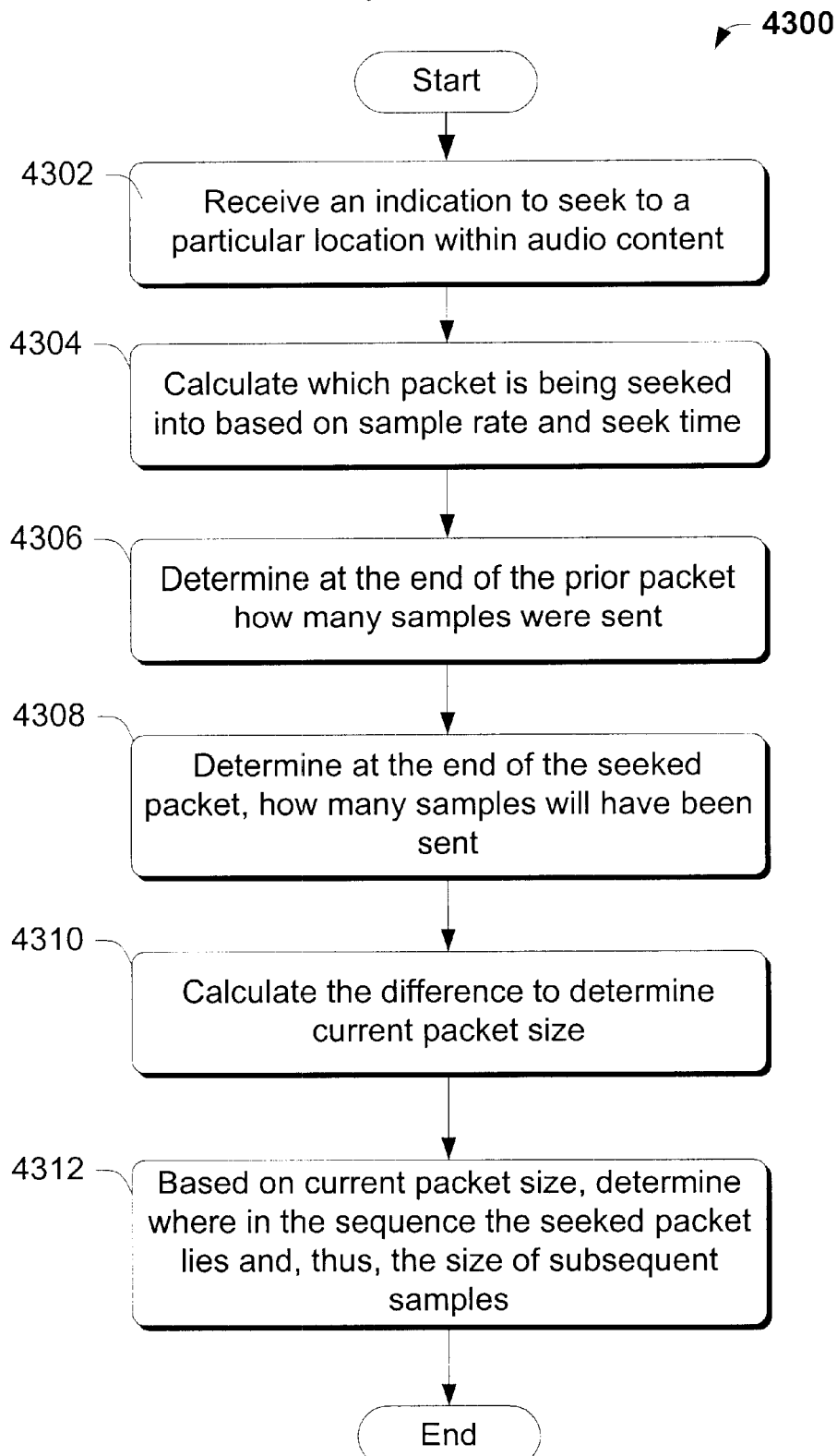

SYSTEM AND RELATED METHODS FOR PROCESSING AUDIO CONTENT IN A FILTER GRAPH

TECHNICAL FIELD

This invention generally relates to processing media content and, more particularly, to a system and related methods for processing audio content in a filter graph.

BACKGROUND

Recent advances in computing power and related technology have fostered the development of a new generation of powerful software applications. Gaming applications, communications applications, and multimedia applications have particularly benefited from increased processing power and clocking speeds. Indeed, once the province of dedicated, specialty workstations, many personal computing systems now have the capacity to receive, process and render multimedia objects (e.g., audio and video content). While the ability to display (receive, process and render) multimedia content has been around for a while, the ability for a standard computing system to support true multimedia editing applications is relatively new.

In an effort to satisfy this need, Microsoft Corporation introduced an innovative development system supporting advanced user-defined multimedia editing functions. An example of this architecture is presented in U.S. Pat. No. 5,913,038 issued to Griffiths and commonly owned by the assignee of the present invention, the disclosure of which is expressly incorporated herein by reference.

In the '038 patent, Griffiths introduced the an application program interface which, when exposed to higher-level development applications, enable a user to graphically construct a multimedia processing project by piecing together a collection of "filters" exposed by the interface. The interface described therein is referred to as a filter graph manager. The filter graph manager controls the data structure of the filter graph and the way data moves through the filter graph. The filter graph manager provides a set of component object model (COM) interfaces for communication between a filter graph and its application. Filters of a filter graph architecture are preferably implemented as COM objects, each implementing one or more interfaces, each of which contains a predefined set of functions, called methods. Methods are called by an application program or other component objects in order to communicate with the object exposing the interface. The application program can also call methods or interfaces exposed by the filter graph manager object.

Filter graphs work with data representing a variety of media (or non-media) data types, each type characterized by a data stream that is processed by the filter components comprising the filter graph. A filter positioned closer to the source of the data is referred to as an upstream filter, while those further down the processing chain is referred to as a downstream filter. For each data stream that the filter handles it exposes at least one virtual pin (i.e., distinguished from a physical pin such as one might find on an integrated circuit). A virtual pin can be implemented as a COM object that represents a point of connection for a unidirectional data stream on a filter. Input pins represent inputs and accept data into the filter, while output pins represent outputs and provide data to other filters. Each of the filters include at least one memory buffer, wherein communication of the media stream between filters is accomplished by a series of "copy" operations from one filter to another.

As introduced in Griffiths, a filter graph has three different types of filters: source filters, transform filters, and rendering filters. A source filter is used to load data from some source; a transform filter processes and passes data; and a rendering filter renders data to a hardware device or other locations (e.g., saved to a file, etc.). An example of a filter graph for a simplistic media rendering process is presented with reference to FIG. 1.

FIG. 1 graphically illustrates an example filter graph for rendering media content. As shown, the filter graph 100 is comprised of a plurality of filters 102–114, which read, process (transform) and render media content from a selected source file. As shown, the filter graph includes each of the types of filters described above, interconnected in a linear fashion.

Products utilizing the filter graph have been well received in the market as it has opened the door to multimedia editing using otherwise standard computing systems. It is to be appreciated, however, that the construction and implementation of the filter graphs are computationally intensive and expensive in terms of memory usage. Even the most simple of filter graphs requires and abundance of memory to facilitate the copy operations required to move data between filters. Thus, complex filter graphs can become unwieldy, due in part to the linear nature of conventional development system architecture. Moreover, it is to be appreciated that the filter graphs themselves consume memory resources, thereby compounding the issue introduced above.

Thus, what is required is a filter graph architecture which reduces the computational and memory resources required to support even the most complex of multimedia projects. Indeed, what is required is a development interface and related methods that dynamically generates a filter graph during project execution, thereby improving the perceived performance of the development system. Just such a solution is disclosed below.

SUMMARY

This invention concerns a system and related interfaces supporting the processing of media content. In accordance with one aspect of the present embodiment, a method comprising identifying a sample rate of received audio content, receiving a conversion sample rate, and converting the received audio content to the received conversion sample rate. Wherein the conversion comprises utilizing a repeating sequence of packets where all but one of the packets of each sequence are truncated to a whole number of samples, while the remaining packet is rounded up to the next whole number of samples if the conversion fails to resolve packet size to a whole number.

BRIEF DESCRIPTION OF THE DRAWINGS

The same reference numbers are used throughout the figures to reference like components and features.

FIG. 1 is a graphical representation of a conventional filter graph representing a user-defined development project.

FIG. 2 is a block diagram of a computing system incorporating the teachings of the described embodiment.

FIG. 3 is a block diagram of an example software architecture incorporating the teachings of the described embodiment.

FIGS. 13–18 graphically illustrate various states of a matrix switch programming grid at select points in processing the project of FIGS. 9 and 10 through the matrix switch, in accordance with one described embodiment.

FIGS. 31–37 graphically illustrate various matrix switch programming grid states at select points in generating and configuring the matrix switch to implement the media processing of FIG. 29.

FIG. 40 illustrates a block diagram of an audio conversion filter, according to one embodiment of the present invention.

FIG. 41 graphically illustrates the conversion from source audio content to packetized audio content through the audio conversion filter, according to one embodiment of the present invention.

FIG. 43 illustrates a flow chart of an example method for facilitating random seeks into a stream of audio packets, in accordance with one aspect of the present invention.

DETAILED DESCRIPTION

Related Applications

Figure 4:
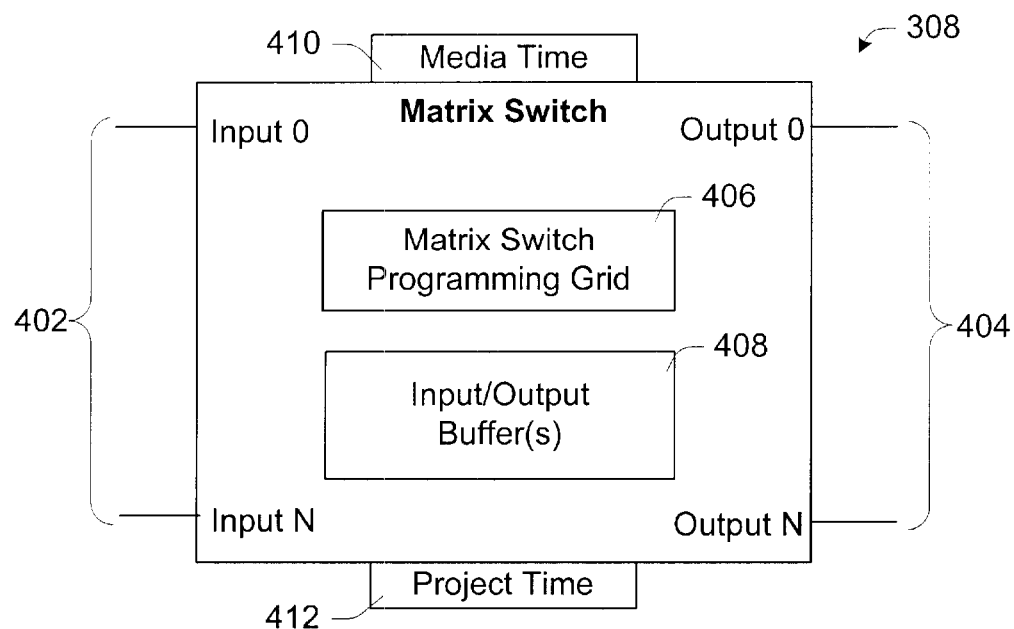
FIG. 4 is a graphical illustration of an example software-enabled matrix switch, according to an exemplary embodiment.

This application is related to the following commonly-filed U.S. patent applications, all of which are commonly assigned to Microsoft Corp., the disclosures of which are incorporated by reference herein:

Application Ser. No. 09/731,560, entitled "An Interface and Related Methods for Reducing Source Accesses in a Development System", naming Daniel J. Miller and Eric H. Rudolph as inventors, and bearing attorney docket number MS1-643US;

Application Ser. No. 09/732,084, entitled "A System and Related Interfaces Supporting the Processing of Media Content", naming Daniel J. Miller and Eric H. Rudolph as inventors, and bearing attorney docket number MS1-629US;

Application Ser. No. 09/731,490, entitled "A System and Related Methods for Reducing Source Filter Invocation in a Development Project", naming Daniel J. Miller and Eric H. Rudolph as inventors, and bearing attorney docket number MS1-631US;

Application Ser. No. 09/732,452, entitled "A System and Related Methods for Reducing Memory Requirements of a Media Processing System", naming Daniel J. Miller and Eric H. Rudolph as inventors, and bearing attorney docket number MS1-632US;

Application Ser. No. 09/731,529, entitled "A System and Related Methods for Reducing the Instances of Source Files in a Filter Graph", naming Daniel J. Miller and Eric H. Rudolph as inventors, and bearing attorney docket number MS1-633US;

Application Ser. No. 09/732,087, entitled "An Interface and Related Methods for Dynamically Generating a Filter Graph in a Development System", naming Daniel J. Miller and Eric H. Rudolph as inventors, and bearing attorney docket number MS1-634US;

Application Ser. No. 09/732,085, entitled "A System and Methods for Generating and Managing Filter Strings in a Filter Graph", naming Daniel J. Miller and Eric H. Rudolph as inventors, and bearing attorney docket number MS1-642US;

Application Ser. No. 09/731,491, entitled "Methods and Systems for Processing Media Content", naming Daniel J. Miller and Eric H. Rudolph as inventors, and bearing attorney docket number MS1-640US;

Application Ser. No. 09/731,563, entitled "Systems for Managing Multiple Inputs and Methods and Systems for Processing Media Content", naming Daniel J. Miller and Eric H. Rudolph as inventors, and bearing attorney docket number MS1-635US;

Application Ser. No. 09/731,892, entitled "Methods and Systems for Implementing Dynamic Properties on Objects that Support Only Static Properties", naming Daniel J. Miller and David Maymudes as inventors, and bearing attorney docket number MS1-638US;

Application Ser. No. 09/732,089, entitled "Methods and Systems for Efficiently Processing Compressed and Uncompressed Media Content", naming Daniel J. Miller and Eric H. Rudolph as inventors, and bearing attorney docket number MS1-630US;

Application Ser. No. 09/731,581, entitled "Methods and Systems for Effecting Video Transitions Represented By Bitmaps", naming Daniel J. Miller and David Maymudes as inventors, and bearing attorney docket number MS1-637US;

Application Ser. No. 09/732,372, entitled "Methods and Systems for Mixing Digital Audio Signals", naming Eric H. Rudolph as inventor, and bearing attorney docket number MS1-636US; and Application Ser. No. 09/732,086, entitled "Methods and Systems for Processing Multi-media Editing Projects", naming Eric H. Rudolph as inventor, and bearing attorney docket number MS1-641US.

Various described embodiments concern an application program interface associated with a development system. According to one example implementation, the interface is exposed to a media processing application to enable a user to dynamically generate complex media processing tasks, e.g., editing projects. In the discussion herein, aspects of the invention are developed within the general context of computer-executable instructions, such as program modules, being executed by one or more conventional computers. Generally, program modules include routines, programs, objects, components, data structures, etc. that perform particular tasks or implement particular abstract data types. Moreover, those skilled in the art will appreciate that the invention may be practiced with other computer system configurations, including hand-held devices, personal digital assistants, multiprocessor systems, microprocessor-based or programmable consumer electronics, network PCs, minicomputers, mainframe computers, and the like. In a distributed computer environment, program modules may be located in both local and remote memory storage devices. It is noted, however, that modification to the architecture and methods described herein may well be made without deviating from spirit and scope of the present invention. Moreover, although developed within the context of a media processing system paradigm, those skilled in the art will appreciate, from the discussion to follow, that the application program interface may well be applied to other development system implementations. Thus, the media processing system described below is but one illustrative implementation of a broader inventive concept.

Example System Architecture

FIG. 2 illustrates an example of a suitable computing environment 200 on which the system and related methods for processing media content may be implemented.

It is to be appreciated that computing environment 200 is only one example of a suitable computing environment and is not intended to suggest any limitation as to the scope of use or functionality of the media processing system. Neither should the computing environment 200 be interpreted as having any dependency or requirement relating to any one or combination of components illustrated in the exemplary computing environment 200.

The media processing system is operational with numerous other general purpose or special purpose computing system environments or configurations. Examples of well known computing systems, environments, and/or configurations that may be suitable for use with the media processing system include, but are not limited to, personal computers, server computers, thin clients, thick clients, hand-held or laptop devices, multiprocessor systems, microprocessor-based systems, set top boxes, programmable consumer electronics, network PCs, minicomputers, mainframe computers, distributed computing environments that include any of the above systems or devices, and the like.

In certain implementations, the system and related methods for processing media content may well be described in the general context of computer-executable instructions, such as program modules, being executed by a computer. Generally, program modules include routines, programs, objects, components, data structures, etc. that perform particular tasks or implement particular abstract data types. The media processing system may also be practiced in distributed computing environments where tasks are performed by remote processing devices that are linked through a communications network. In a distributed computing environment, program modules may be located in both local and remote computer storage media including memory storage devices.

In accordance with the illustrated example embodiment of FIG. 2 computing system 200 is shown comprising one or more processors or processing units 202, a system memory 204, and a bus 206 that couples various system components including the system memory 204 to the processor 202.

Bus 206 is intended to represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) buss also known as Mezzanine bus.

Computer 200 typically includes a variety of computer readable media. Such media may be any available media that is locally and/or remotely accessible by computer 200, and it includes both volatile and non-volatile media, removable and non-removable media.

In FIG. 2, the system memory 204 includes computer readable media in the form of volatile, such as random access memory (RAM) 210, and/or non-volatile memory, such as read only memory (ROM) 208. A basic input/output system (BIOS) 212, containing the basic routines that help to transfer information between elements within computer 200, such as during start-up, is stored in ROM 208. RAM 210 typically contains data and/or program modules that are immediately accessible to and/or presently be operated on by processing unit(s) 202.

Computer 200 may further include other removable/non-removable, volatile/non-volatile computer storage media. By way of example only, FIG. 2 illustrates a hard disk drive 228 for reading from and writing to a non-removable, non-volatile magnetic media (not shown and typically called a "hard drive"), a magnetic disk drive 230 for reading from and writing to a removable, non-volatile magnetic disk 232 (e.g., a "floppy disk"), and an optical disk drive 234 for reading from or writing to a removable, non-volatile optical disk 236 such as a CD-ROM, DVD-ROM or other optical media. The hard disk drive 228, magnetic disk drive 230, and optical disk drive 234 are each connected to bus 206 by one or more interfaces 226.

The drives and their associated computer-readable media provide nonvolatile storage of computer readable instructions, data structures, program modules, and other data for computer 200. Although the exemplary environment described herein employs a hard disk 228, a removable magnetic disk 232 and a removable optical disk 236, it should be appreciated by those skilled in the art that other types of computer readable media which can store data that is accessible by a computer, such as magnetic cassettes, flash memory cards, digital video disks, random access memories (RAMs), read only memories (ROM), and the like, may also be used in the exemplary operating environment.

A number of program modules may be stored on the hard disk 228, magnetic disk 232, optical disk 236, ROM 208, or RAM 210, including, by way of example, and not limitation, an operating system 214, one or more application programs 216 (e.g., multimedia application program 224), other program modules 218, and program data 220. In accordance with the illustrated example embodiment of FIG. 2, operating system 214 includes an application program interface embodied as a render engine 222. As will be developed more fully below, render engine 222 is exposed to higher-level applications (e.g., 216) to automatically assemble filter graphs in support of user-defined development projects, e.g., media processing projects. Unlike conventional media processing systems, however, render engine 222 utilizes a scalable, dynamically reconfigurable matrix switch to reduce filter graph complexity, thereby reducing the computational and memory resources required to complete a development project. Various aspects of the innovative media processing system represented by a computer 200 implementing the innovative render engine 222 will be developed further, below.

Continuing with FIG. 2, a user may enter commands and information into computer 200 through input devices such as keyboard 238 and pointing device 240 (such as a "mouse"). Other input devices may include a audio/video input device(s) 253, a microphone, joystick, game pad, satellite dish, serial port, scanner, or the like (not shown). These and other input devices are connected to the processing unit(s) 202 through input interface(s) 242 that is coupled to bus 206, but may be connected by other interface and bus structures, such as a parallel port, game port, or a universal serial bus (USB).

A monitor 256 or other type of display device is also connected to bus 206 via an interface, such as a video adapter 244. In addition to the monitor, personal computers typically include other peripheral output devices (not shown), such as speakers and printers, which may be connected through output peripheral interface 246.

Computer 200 may operate in a networked environment using logical connections to one or more remote computers, such as a remote computer 250. Remote computer 250 may include many or all of the elements and features described herein relative to computer 200 including, for example, render engine 222 and one or more development applications 216 utilizing the resources of render engine 222.

As shown in FIG. 2, computing system 200 is communicatively coupled to remote devices (e.g., remote computer 250) through a local area network (LAN) 251 and a general wide area network (WAN) 252. Such networking environments are commonplace in offices, enterprise-wide computer networks, intranets, and the Internet.

When used in a LAN networking environment, the computer 200 is connected to LAN 251 through a suitable network interface or adapter 248. When used in a WAN networking environment, the computer 200 typically includes a modem 254 or other means for establishing communications over the WAN 252. The modem 254, which may be internal or external, may be connected to the system bus 206 via the user input interface 242, or other appropriate mechanism.

In a networked environment, program modules depicted relative to the personal computer 200, or portions thereof, may be stored in a remote memory storage device. By way of example, and not limitation, FIG. 2 illustrates remote application programs 216 as residing on a memory device of remote computer 250. It will be appreciated that the network connections shown and described are exemplary and other means of establishing a communications link between the computers may be used.

Turning next to FIG. 3, a block diagram of an example development system architecture is presented, in accordance with one embodiment of the present invention. In accordance with the illustrated example embodiment of FIG. 3, development system 300 is shown comprising one or more application program(s) 216 coupled to render engine 222 via an appropriate communications interface 302. As used herein, application program(s) 216 are intended to represent any of a wide variety of applications which may benefit from use of render engine 222 such as, for example a media processing application 224.

The communications interface 302 is intended to represent any of a number of alternate interfaces used by operating systems to expose application program interface(s) to applications. According to one example implementation, interface 302 is a component object model (COM) interface, as used by operating systems offered by Microsoft Corporation. As introduced above, COM interface 302 provides a means by which the features of the render engine 222, to be described more fully below, are exposed to an application program 216.

In accordance with the illustrated example implementation of FIG. 3, render engine 222 is presented comprising source filter(s) 304A–N, transform filter(s) 306A–N and render filter 310, coupled together utilizing virtual pins to facilitate a user-defined media processing project. According to one implementation, the filters of system 300 are similar to the filters exposed in conventional media processing systems. According to one implementation, however, filters are not coupled via such interface pins. Rather, alternate implementations are envisioned wherein individual filters (implemented as objects) make calls to other objects, under the control of the render engine 222, for the desired input. Unlike conventional systems, however, render engine 222 exposes a scalable, dynamically reconfigurable matrix switch filter 308, automatically generated and dynamically configured by render engine 222 to reduce the computational and memory resource requirements often associated with development projects. As introduced above, the pins (input and/or output) are application interface(s) designed to communicatively couple other objects (e.g., filters).

In accordance with the example implementation of a media processing system, an application communicates with an instance of render engine 222 when the application 216 wants to process streaming media content. Render engine 222 selectively invokes and controls an instance of filter graph manager (not shown) to automatically create a filter graph by invoking the appropriate filters (e.g., source, transform and rendering). As introduced above, the communication of media content between filters is achieved by either (1) coupling virtual output pins of one filter to the virtual input pins of requesting filter; or (2) by scheduling object calls between appropriate filters to communicate the requested information. As shown, source filter 304 receives streaming data from the invoking application or an external source (not shown). It is to be appreciated that the streaming data can be obtained from a file on a disk, a network, a satellite feed, an Internet server, a video cassette recorder, or other source of media content. As introduced above, transform filter(s) 306 take the media content and processes it in some manner, before passing it along to render filter 310. As used herein, transform filter(s) 306 are intended to represent a wide variety of processing methods or applications that can be performed on media content. In this regard, transform filter(s) 306 may well include a splitter, a decoder, a sizing filter, a transition filter, an effects filter, and the like. The function of each of these filters is described more fully in the Griffiths application, introduced above, and generally incorporated herein by reference. The transition filter, as used herein, is utilized by render engine 222 to transition the rendered output from a first source to a second source. The effect filter is selectively invoked to introduce a particular effect (e.g., fade, wipe, audio distortion, etc.) to a media stream.

In accordance with one aspect of the embodiment, to be described more fully below, matrix switch filter 308 selectively passes media content from one or more of a scalable plurality of input(s) to a scalable plurality of output(s). Moreover, matrix switch 308 also supports implementation of a cascaded architecture utilizing feedback paths, i.e., wherein transform filters 306B, 306C, etc. coupled to the output of matrix switch 308 are dynamically coupled to one or more of the scalable plurality of matrix switch input(s). An example of this cascaded filter graph architecture is introduced in FIG. 3, and further explained in example implementations, below.

Typically, media processed through source, transform and matrix switch filters are ultimately passed to render filter 310, which provides the necessary interface to a hardware device, or other location that accepts the renderer output format, such as a memory or disk file, or a rendering device.

FIG. 4 is a graphical illustration of an example software-enabled matrix switch 308, according to one example embodiment of the present invention. As shown, the matrix switch 308 is comprised of a scalable plurality of input(s) 402 and a scalable plurality of output(s) 404, wherein any one or more of the input(s) 402 may be iteratively coupled to any one or more of the output(s) 404, based on the content of the matrix switch programming grid 406, automatically generated by render engine 222. According to an alternate implementation introduced above, switch matrix 308 is programmed by render engine 222 to dynamically generate object calls to communicate media content between filters. In addition, according to one implementation, matrix switch 308 includes a plurality of input/output (I/O) buffers 408, as well as means for maintaining source, or media time 410 and/or timeline, or project time 412. It is to be appreciated, however, that in alternate implementations matrix switch 308 does not maintain both source and project times, relying on an upstream filter to convert between these times. As will be developed more fully below, matrix switch 308 dynamically couples one or more of the scalable plurality of inputs 402 to one or more of the scalable plurality of outputs 404 based, at least in part, on the media time 410 and/or the project time 412 and the content of matrix switch programming grid 406. In this regard, matrix switch 308 may be characterized as time-aware, supporting such advanced editing features as searching/seeking to a particular point (e.g., media time) in the media content, facilitating an innovative buffering process utilizing I/O buffers 408 to facilitate look-ahead processing of media content, and the like. Thus, it will be appreciated given the discussion to follow that introduction of the matrix switch 308 provides a user with an editing flexibility that was heretofore unavailable in a personal computer-based media processing system.

As introduced above, the inputs 402 and outputs 404 of matrix switch 308 are interfaces which facilitate the time-sensitive routing of data (e.g., media content) in accordance with a user-defined development project. Matrix switch 308 has a scalable plurality of inputs 402 and outputs 404, meaning that the number of inputs 402 and outputs 404 are individually generated to satisfy a given editing project. Insofar as each of the inputs/outputs (I/O) has an associated transfer buffer (preferably shared with an adjacent filter) to communicate media content, the scalability of the input/output serves to reduce the overall buffer memory consumed by an editing project. According to one implementation, output 1 is generally reserved as a primary output, e.g., coupled to a rendering filter (not shown).

According to one implementation, for each input 402 and output 404, matrix switch 308 attempts to be the allocator, or manager of the buffer associated with the I/O(s) shared with adjacent filters. One reason is to ensure that all of the buffers are of the same size and share common attributes so that a buffer associated with any input 402 may be shared with any output 404, thereby reducing the need to copy memory contents between individual buffers associated with such inputs/outputs. If matrix switch 308 cannot be an allocator for a given output (404), communication from an input (402) to that output is performed using a conventional memory copy operation between the individual buffers associated with the select input/output.

As introduced above, the matrix switch programming grid 406 is dynamically generated by render engine 222 based, at least in part, on the user-defined development project. As will be developed below, render engine 222 invokes an instance of filter graph manager to assembles a tree structure of an editing project, noting dependencies between source, filters and time to dynamically generate the programming grid 406. A data structure comprising an example programming grid 406 is introduced with reference to FIG. 5, below.

Figure 5:
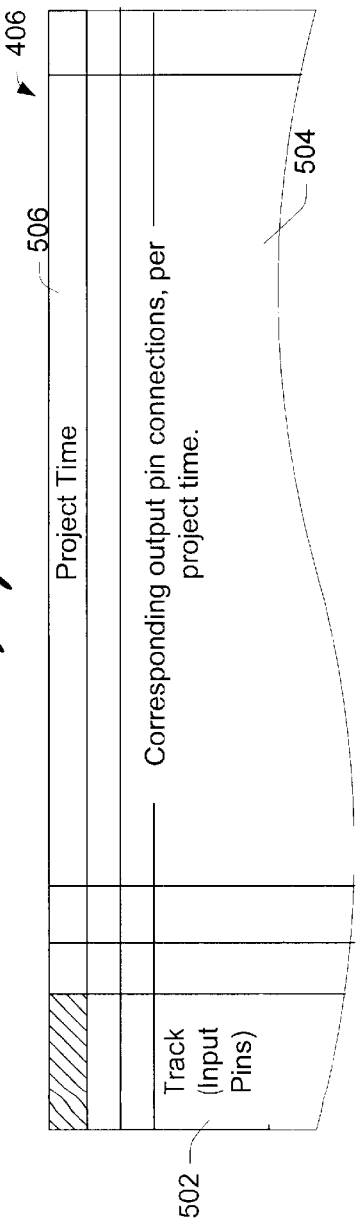
FIG. 5 is a graphical representation of a data structure comprising a programming grid to selectively couple one or more of a scalable plurality of input pins to a scalable plurality of output pins of the matrix switch filter, in accordance with one aspect of the described embodiment.

Turning briefly to FIG. 5, a graphical representation of a data structure comprising an example programming grid 406 is presented, in accordance with one embodiment of the present invention. In accordance with the illustrated example embodiment of FIG. 5, programming grid 406 is depicted as a two-dimensional data structure comprising a column along the y-axis 502 of the grid denoting input pins associated with a content chain (e.g., series of filters to process media content) of the development project. The top row along the x-axis 504 of the data structure denotes project time. With these grid "borders", the body 506 of the grid 406 is populated with output pin assignments, denoting which input pin is coupled to which output pin during execution of the development project. In this way, render engine 222 dynamically generates and facilitates matrix switch 308. Those skilled in the art will appreciate, however, that data structures of greater or lesser complexity may well be used in support of the programming grid 406 without deviating from the spirit and scope of the present invention.

Returning to FIG. 4, matrix switch 308 is also depicted with a plurality of input/output buffers 408, shared among all of the input(s)/ouptut(s) (402, 404) to facilitate advanced processing features. That is, while not required to implement the core features of matrix switch 308, I/O buffers 408 facilitate a number of innovative performance enhancing features to improve the performance (or at least the user's perception of performance) of the processing system, thereby providing an improved user experience. According to one implementation, I/O buffers 408 are separate from the buffers assigned to each individual input and output pin in support of communication through the switch. According to one implementation, I/O buffers 408 are primarily used to foster look-ahead processing of the project. Assume, for example, that a large portion of the media processing project required only 50% of the available processing power, while some smaller portion required 150% of the available processing power. Implementation of the shared I/O buffers 408 enable filter graph manager to execute tasks ahead of schedule and buffer this content in the shared I/O buffers 408 until required. Thus, when execution of the filter graph reaches a point where more than 100% of the available processing power is required, the processing system can continue to supply content from the I/O buffers 408, while the system completes execution of the CPU-intensive tasks. If enough shared buffer space is provided, the user should never know that some tasks were not performed in real-time. According to one implementation, shared buffers 408 are dynamically split into two groups by render engine 222, a first group supports the input(s) 402, while a second (often smaller) group is used in support of a primary output (e.g., output pin 1) to facilitate a second, independent output processing thread. The use of an independent output buffers the render engine from processing delays that might occur in upstream and/or downstream filters, as discussed above. It will be appreciated by those skilled in the art that such that matrix switch 308 and the foregoing described architecture beneficially suited to support media streaming applications.

As introduced above, the filter graph is time-aware in the sense that media (source) time and project execution time are maintained. According to one implementation, matrix switch 308 maintains at least the project clock, while an upstream filter maintains the source time, converting between source and project time for all downstream filters (i.e., including the matrix switch 308). According to one implementation, the frame rate converter filter of a filter graph is responsible for converting source time to project time, and vice versa, i.e., supporting random seeks, etc. Alternatively, matrix switch 308 utilizes an integrated set of clock(s) to independently maintain project and media times.

Figure 6:
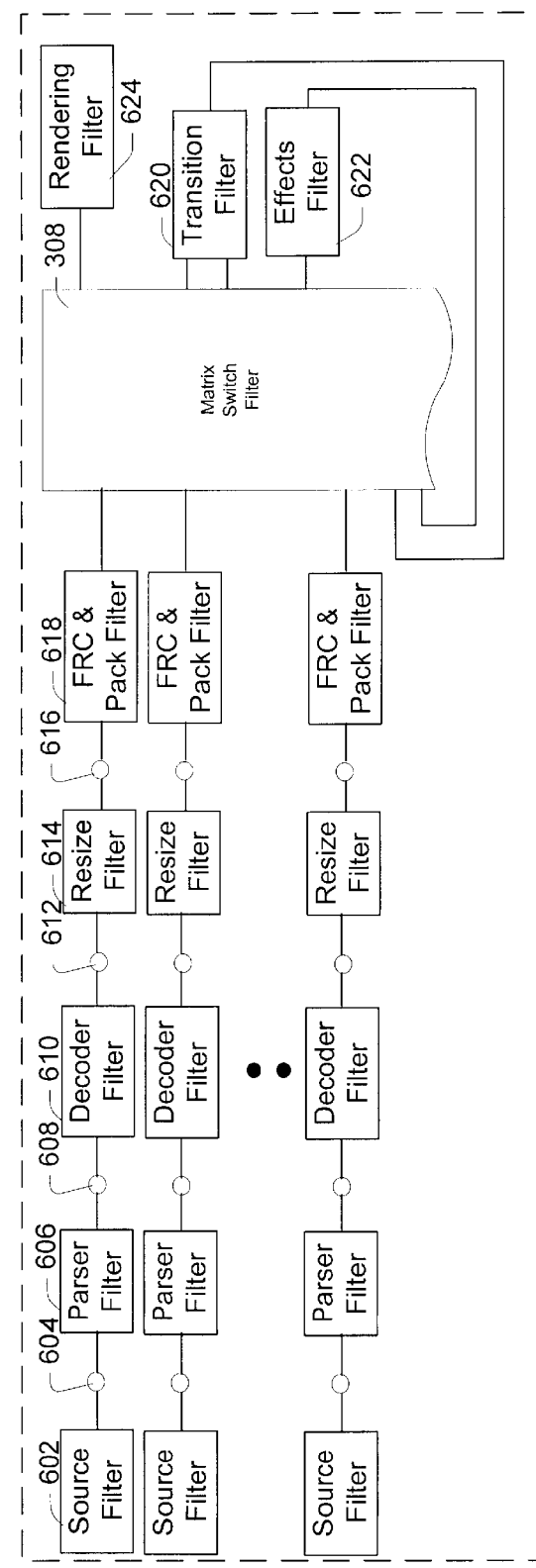
FIG. 6 is a graphical illustration denoting shared buffer memory between filters, according to one aspect of the described embodiment.

Having introduced the architectural and operational elements of matrix switch filter 308, FIG. 6 graphically illustrates an example filter graph implementation incorporating the innovative matrix switch 308. In accordance with the illustrated example embodiment, filter graph 600 is generated by render engine 222 in response to a user defined development project. Unlike the lengthy linear filter graphs typical of convention development systems however, filter graph 600 is shown incorporating a matrix switch filter 308 to recursively route the pre-processed content (e.g., through filters 602, 606, 610, 614 and 618, described more fully below) through a user-defined number of transform filters including, for example, transition filter(s) 620 and effects filter(s) 622. Moreover, as will be developed more fully below, the scalable nature of matrix switch filter 308 facilitates such iterative processing for any number of content threads, tracks or compositions.

According to one implementation, a matrix switch filter 308 can only process one type of media content, of the same size and at the same frame-rate (video) or modulation type/schema (audio). Thus, FIG. 6 is depicted comprising pre-processing filters with a parser filter 606 to separate, independent content type(s) (e.g., audio content and video content), wherein one of the media types would be processed along a different path including a separate instance of matrix switch 308. Thus, in accordance with the illustrated example embodiment of a media processing system, processing multimedia content including audio and video would utilize two (2) matrix switch filters 308, one dedicated to audio processing (not shown) and one dedicated to video processing. That is not to say, however, that multiple switch filters 308 could not be used (e.g., two each for audio and video) for each content type in alternate implementations. Similarly, it is anticipated that in alternate implementations a matrix switch 308 that accepts multiple media types could well be used without deviating from the spirit and scope of the present invention.

In addition filter graph 600 includes a decoder filter 610 to decode the media content. Resize filter 614 is employed when matrix switch 308 is to receive content from multiple sources, ensuring that the size of the received content is the same, regardless of the source. According to one implementation, resize filter 614 is selectively employed in video processing paths to adjust the media size of content from one or more sources to a user-defined level. Alternatively, resizer filter 614 adjusts the media size to the largest size provided by any one or more media sources. That is, if, for example, render engine 222 identifies the largest required media size (e.g., 1270×1040 video pixels per frame) and, for any content source not providing content at this size, the content is modified (e.g., stretched, packed, etc.) to fill this size requirement. The frame rate converter (FRC) and pack filter 618, introduced above, ensures that video content from the multiple sources is arriving at the same frame rate, e.g., ten (10) frames per second. As introduced above, the FRC also maintains the distinction between source time and project time.

In accordance with one aspect of the present invention, filter graph 600 is depicted utilizing a single, negotiated buffer 604, 608, 612, 616, etc. between adjacent filters. In this regard, render engine 222 reduces the buffer memory requirements in support of a development project.

From the point of pre-processing (filters 602, 606, 610, 614, 618), rather than continue a linear filter graph incorporating all of the transition 620 and effect 622 filter(s), render engine 222 utilizes a cascade architecture, recursively passing media content through the matrix switch 308 to apply to the transform filter(s) (e.g., 620, 622, etc.) to complete the execution of the development project. It will be appreciated by those skilled in the art that the ability to recursively pass media content through one or more effect and/or transition filters provided by the matrix switch filter 308 greatly reduces the perceived complexity of otherwise large filter graphs, while reducing memory and computational overhead.

Figure 7:
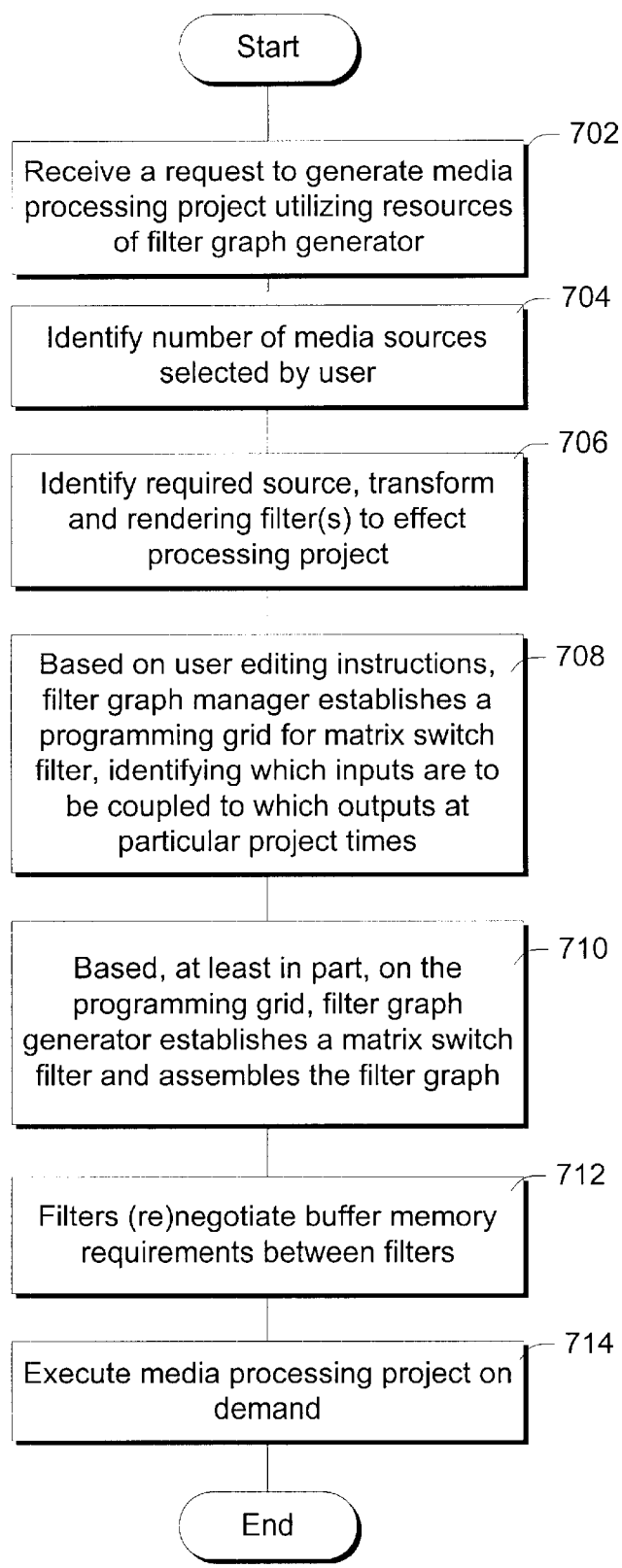
FIG. 7 is a flow chart of an example method for generating a filter graph, in accordance with one aspect of the described embodiment.

Turning to FIG. 7, a flow chart of an example method for generating a filter graph is presented, in accordance with one aspect of the present invention. The method 700 begins with block 702 wherein render engine 222 receives an indication to generate a filter graph representing a user-defined development project (e.g., a media editing project). According to one example implementation, the indication is received from an application 224 via COM interface(s) 302.

In block 704, render engine 222 facilitates generation of the editing project, identifying the number and type of media sources selected by the user. In block 706, based at least in part on the number and/or type of media sources, filter graph manger 222 exposes source, transform and rendering filter(s) to effect a user defined media processing project, while beginning to establish a programming grid 406 for the matrix switch filter 308.

In block 708, reflecting user editing instructions, render engine 222 completes the programming grid 406 for matrix switch 308, identifying which inputs 402 are to be coupled to which outputs 404 at particular project times.

Based, at least in part, on the programming grid 406 render engine 222 generates a matrix switch filter 308 with an appropriate number of input 402 and output 404 pins to effect the project, and assembles the filter graph, block 710.

In block 712, to reduce the buffer memory requirements for the processing project, the render engine 222 instructs the filters populating the filter graph to (re)negotiate buffer memory requirements between filters. That is, adjacent filters attempt to negotiate a size and attribute standard so that a single buffer can be utilized to couple each an output pin of one filter to an input pin of a downstream filter. An example implementation of the buffer negotiation process of block 712 is presented in greater detail with reference to FIG. 8.

Figure 8:
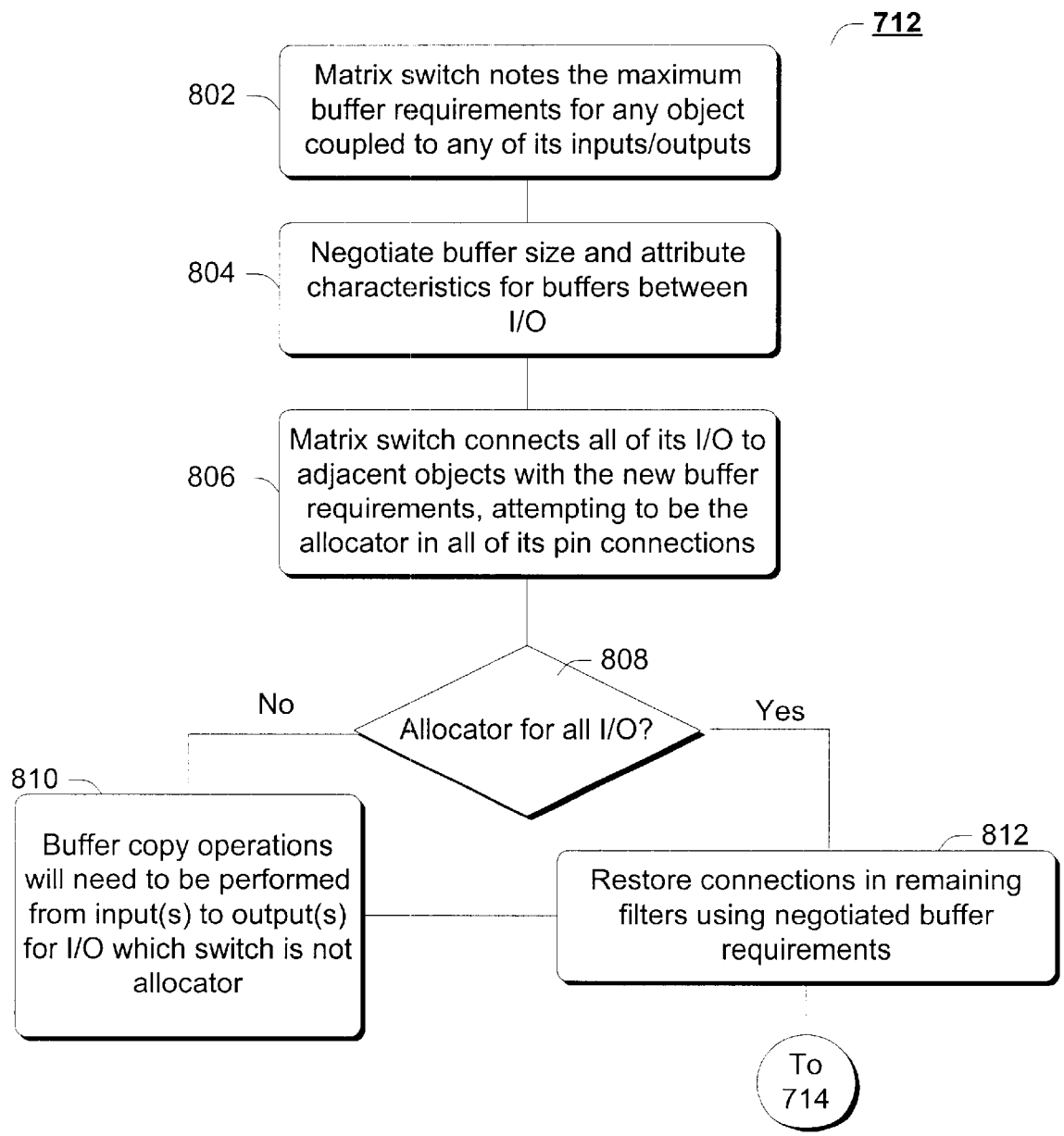
FIG. 8 is a flow chart of an example method for negotiating buffer requirements between at least two adjacent filters, according to one aspect of the described embodiment.

Turning briefly to FIG. 8, an example method of negotiating buffer requirements between adjacent filters is presented, in accordance with one example implementation of the present invention. Once the final connection is established to matrix switch 308, matrix switch 308 identifies the maximum buffer requirements for any filter coupled to any of its pins (input 402 and/or output 404), block 802. According to one implementation, the maximum buffer requirements are defined as the lowest common multiple of buffer alignment requirements, and the maximum of all the pre-fix requirements of the filter buffers.

In block 804, matrix switch 308 selectively removes one or more existing filter connections to adjacent filters. Matrix switch 308 then reconnects all of its pins to adjacent filters using a common buffer size between each of the pins, block 806. In block 808, matrix switch 308 negotiates to be the allocator for all of its pins (402, 404). If the matrix switch 308 cannot, for whatever reason, be the allocator for any of its input pins 402 minimal loss to performance is encountered, as the buffer associated with the input pin will still be compatible with any downstream filter (i.e., coupled to an output pin) and, thus, the buffer can still be passed to the downstream filter without requiring a memory copy operation. If, however, matrix switch 308 cannot be an allocator for one of its output pins 404, media content must then be transferred to at least the downstream filter associated with that output pin using a memory copy operation, block 810.

In block 812, once the matrix switch 308 has re-established its connection to adjacent filters, render engine 222 restores the connection in remaining filters using negotiated buffer requirements emanating from the matrix switch filter 308 buffer negotiations. Once the connections throughout the filter graph have been reconnected, the process continues with block 714 of FIG. 7.

In block 714 (FIG. 7), have re-established the connections between filters, render engine 222 is ready to implement a user's instruction to execute the media processing project.

Example Operation and Implementation(s)

The matrix switch described above is quite useful in that it allows multiple inputs to be directed to multiple outputs at any one time. These input can compete for a matrix switch output. The embodiments described below permit these competing inputs to be organized so that the inputs smoothly flow through the matrix switch to provide a desired output. And, while the inventive programming techniques are described in connection with the matrix switch as such is employed in the context of multi-media editing projects, it should be clearly understood that application of the inventive programming techniques and structures should not be so limited only to application in the field of multi-media editing projects or, for that matter, multi-media applications or data streams. Accordingly, the principles about to be discussed can be applied to other fields of endeavor in which multiple inputs can be characterized as competing for a particular output during a common time period.

In the multi-media example below, the primary output of the matrix switch a data stream that defines an editing project that has been created by a user. Recall that this editing project can include multiple different sources that are combined in any number of different ways, and the sources that make up a project can comprise audio sources, video sources, or both. The organization of the inputs and outputs of the matrix switch are made manageable, in the examples described below, by a data structure that permits the matrix switch to be programmed.

Figure 9:
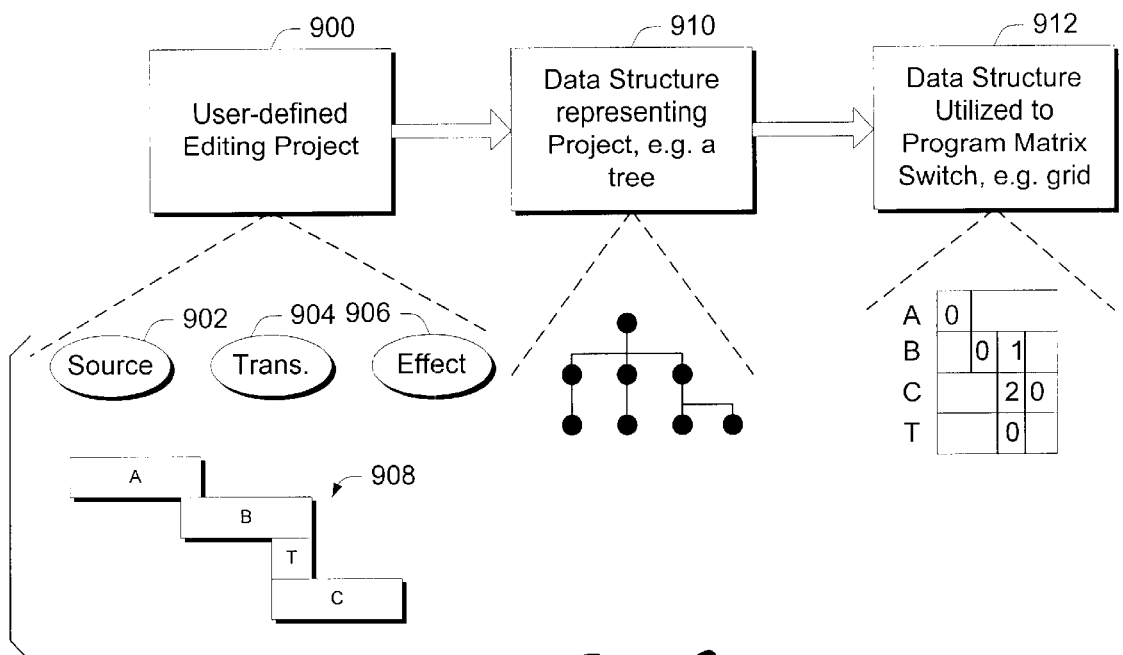
FIG. 9 graphically illustrates an overview of a process that takes a user-defined editing project and composites a data structure that can be used to program the matrix switch.

FIG. 9 shows an overview of a process that takes a user-defined editing project and renders from it a data structure that can be used to program the matrix switch.

Specifically, a user-defined editing project is shown generally at 900. Typically, when a user creates an editing project, they can select from a number of different multi-media clips that they can then assemble into a unique presentation. Each individual clip represents a source of digital data or a source stream (e.g., multimedia content). Projects can include one or more sources 902. In defining their project, a user can operate on sources in different ways. For example, video sources can have transitions 904 and effects 906 applied on them. A transition object is a way to change between two or more sources. As discussed above, a transition essentially receives as input, two or more streams, operates on them in some way, and produces a single output stream. An exemplary transition can comprise, for example, fading from one source to another. An effect object can operate on a single source or on a composite of sources. An effect essentially receives a single input stream, operates on it in some way, and produces a single output stream. An exemplary effect can comprise a black-and-white effect in which a video stream that is configured for presentation in color format is rendered into a video stream that is configured for presentation in black and white format. Unlike conventional effect filters, effect object 906 may well perform multiple effect tasks. That is, in accordance with one implementation, an effect object (e.g., 906) may actually perform multiple tasks on the received input stream, wherein said tasks would require multiple effect filters in a conventional filter graph system.

An exemplary user interface 908 is shown and represents what a user might see when they produce a multimedia project with software executing on a computer. In this example, the user has selected three sources A, B, and C, and has assembled the sources into a project timeline. The project timeline defines when the individual sources are to be rendered, as well as when any transitions and/or effects are to occur.

In the discussion that follows, the notion of a track is introduced. A track can contain one or more sources or source clips. If a track contains more than one source clip, the source clips cannot overlap. If source clips are to overlap (e.g. fading from one source to another, or having one source obscure another), then multiple tracks are used. A track can thus logically represent a layer on which sequential video is produced. User interface 908 illustrates a project that utilizes three tracks, each of which contains a different source. In this particular project source A will show for a period of time. At a defined time in the presentation, source A is obscured by source B. At some later time, source B transitions to source C.

In accordance with the described embodiment, the user-defined editing project 900 is translated into a data structure 910 that represents the project. In the illustrated and described example, this data structure 910 comprises a tree structure. It is to be understood, however, that other data structures could be used. The use of tree structures to represent editing projects is well-known and is not described here in any additional detail. Once the data structure 910 is defined, it is processed to provide a data structure 912 that is utilized to program the matrix switch. In the illustrated and described embodiment, data structure 912 comprises a grid from which the matrix switch can be programmed. It is to be understood and appreciated that other data structures and techniques could, however, be used to program the matrix switch without departing from the spirit and scope of the claimed subject matter.

The processing that takes place to define data structures 910 and 912 can take place using any suitable hardware, software, firmware, or combination thereof. In the examples set forth below, the processing takes place utilizing software in the form of a video editing software package that is executable on a general purpose computer.

Example Project

Figure 10:
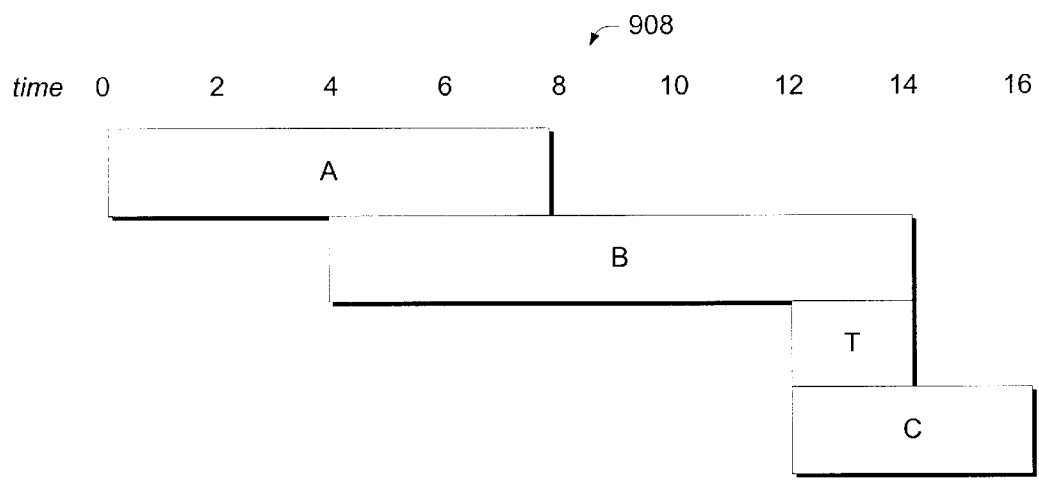
FIG. 10 graphically illustrates the project of FIG. 9 in greater detail.

For purposes of explanation, consider FIG. 10 which shows project 908 from FIG. 9 in a little additional detail. Here, a time line containing numbers 0–16 is provided adjacent the project to indicate when particular sources are to be seen and when transitions and effects (when present) are to occur. In the examples in this document, the following convention exists with respect to projects, such as project 908. A priority exists for video portions of the project such that as one proceeds from top to bottom, the priority increases. Thus, in the FIG. 10 example, source A has the lowest priority followed by source B and source C. Thus, if there is an overlap between higher and lower priority sources, the higher priority source will prevail. For example, source B will obscure source A from between t=4–8.

In this example, the following can be ascertained from the project 908 and time line: from time t=0–4 source A should be routed to the matrix switch's primary output; from t=4–12 source B should be routed to the matrix switch's primary output; from t=12–14 there should be a transition between source B and source C which should be routed to the matrix switch's primary output; and from t=14–16 source C should be routed to the matrix switch's primary output. Thus, relative to the matrix switch, each of the sources and the transition can be characterized by where it is to be routed at any given time. Consider, for example, the table just below:

| Object | Routing for a given time |
| --- | --- |
| C | t = 0–12 (nowhere); t = 12–14 (transition); t = 14–16 (primary output) |
| B | t = 0–4 (nowhere); t = 4–12 (primary output); t = 12–14 (transition); t = 14–16 (nowhere) |
| A | t = 0–4 (primary output); t = 4–16 (nowhere) |

-continued

| Object | Routing for a given time |
| --- | --- |
| Transition | t = 0–12 (nowhere); t = 12–14 (primary output); t = 14–16 (nowhere) |

Figure 11:
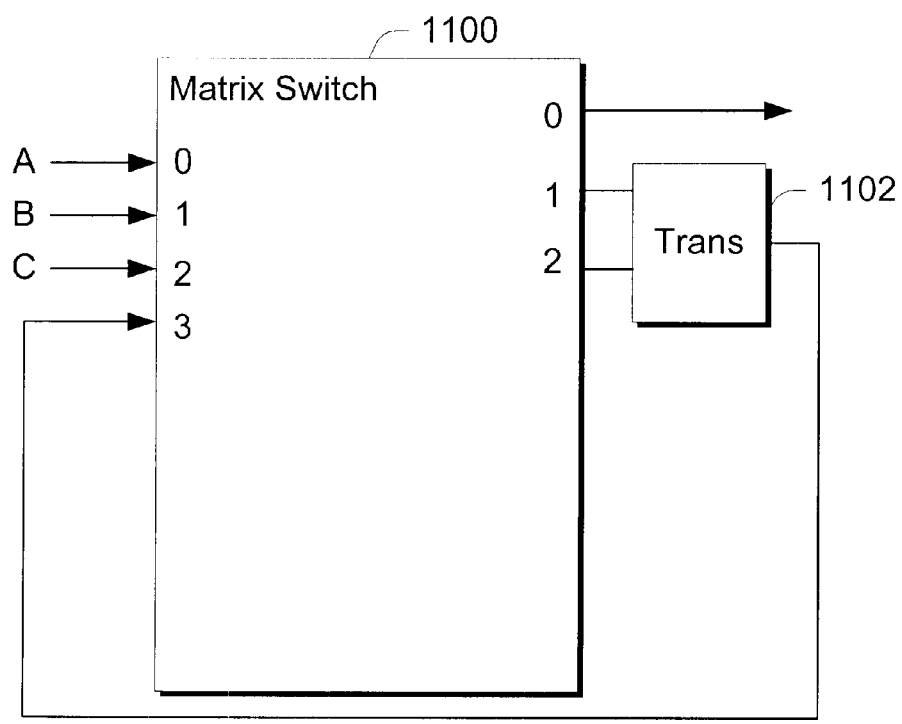
FIG. 11 shows an exemplary matrix switch dynamically generated in support of the project developed in FIGS. 9 and 10, according to one described embodiment.

FIG. 11 shows an exemplary matrix switch 1100 that can be utilized in the presentation of the user's project. Matrix switch 1100 comprises multiple inputs and multiple outputs. Recall that a characteristic of the matrix switch 1100 is that any of the inputs can be routed to any of the outputs at any given time. A transition element 1102 is provided and represents the transition that is to occur between sources B and C. Notice that the matrix switch includes four inputs numbered 0–3 and three outputs numbered 0–2. Inputs 0–2 correspond respectively to sources A–C, while input 3 corresponds to the output of the transition element 1102. Output 0 corresponds to the switch's primary output, while outputs 1 and 2 are routed to the transition element 1102.

The information that is contained in the table above is the information that is utilized to program the matrix switch. The discussion presented below describes but one implementation in which the information contained in the above table can be derived from the user's project time line.

Recall that as a user edits or creates a project, software that comprises a part of their editing software builds a data structure that represents the project. In the FIG. 9 overview, this was data structure 910. In addition to building the data structure that represents the editing project, the software also builds and configures a matrix switch that is to be used to define the output stream that embodies the project. Building and configuring the matrix switch can include building the appropriate graphs (e.g., a collection of software objects, or filters) that are associated with each of the sources and associating those graphs with the correct inputs of the matrix switch. In addition, building and configuring the matrix switch can also include obtaining and incorporating additional appropriate filters with the matrix switch, e.g. filters for transitions, effects, and mixing (for audio streams). This will become more apparent below.

Figure 12:
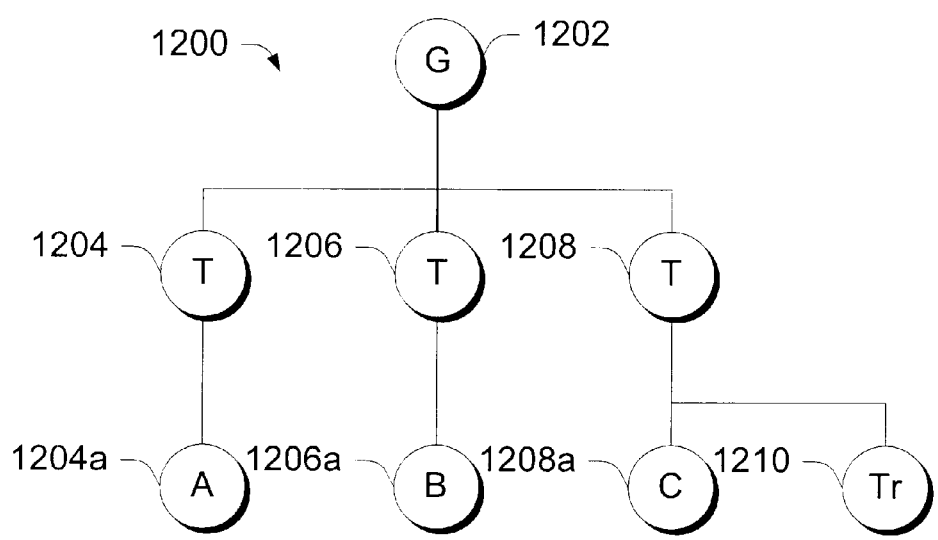
FIG. 12 illustrates a graphic representation of an exemplary data structure that represents the project of FIG. 10, according to one described embodiment.

FIG. 12 shows a graphic representation of an exemplary data structure 1200 that represents the project of FIG. 10. Here, the data structure comprises a traditional hierarchical tree structure. Any suitable data structure can, however, be utilized. The top node 1202 constitutes a group node. A group encapsulates a type of media. For example, in the present example the media type comprises video. Another media type is audio. The group node can have child nodes that are either tracks or composites. In the present example, three track nodes 1204, 1206, and 1208 are shown. Recall that each track can have one or more sources. If a track comprises more than one source, the sources cannot overlap. Here, all of the sources (A, B, and C) overlap. Hence, three different tracks are utilized for the sources. In terms of priority, the lowest priority source is placed into the tree furthest from the left at 1204a. The other sources are similarly placed. Notice that source C (1208a) has a transition 1210 associated with it. A transition object, in this example, defines a two-input/one output operation. When applied to a track or a composition (discussed below in more detail), the transition object will operate between the track to which it has been applied, and any objects that are beneath it in priority and at the same level in the tree. A "tree level" has a common depth within the tree and belongs to the same parent. Accordingly, in this example, the transition 1210 will operate on a source to the left of the track on which source C resides, and beneath it in priority, i.e. source B. If the transition is applied to any object that has nothing beneath it in the tree, it will transition from blackness (and/or silence if audio is included).

Once a data structure representing the project has been built, in this case a hierarchical tree structure, a rendering engine processes the data structure to provide another data structure that is utilized to program the matrix switch. In the FIG. 9 example, this additional data structure is represented at 912. It will be appreciated and understood that the nodes of tree 1200 can include so-called meta information such as a name, ID, and a time value that represents when that particular node's object desires to be routed to the output, e.g. node 1204a would include an identifier for the node associating it with source A, as well as a time value that indicates that source A desires to be routed to the output from time t=0–8. This meta information is utilized to build the data structure that is, in turn, utilized to program the matrix switch.

In the example about to be described below, a specific data structure in the form of a grid is utilized. In addition, certain specifics are described with respect to how the grid is processed so that the matrix switch can be programmed. It is to be understood that the specific described approach is for exemplary purposes only and is not intended to limit application of the claims. Rather, the specific approach constitutes but one way of implementing broader conceptual notions embodied by the inventive subject matter.

FIGS. 13–18 represent a process through which the inventive grid is built. In the grid about to be described, the x axis represents time, and the y axis represents layers in terms of priority that go from lowest (at the top of the grid) to highest (at the bottom of the grid). Every row in the grid represents the video layer. Additionally, entries made within the grid represent output pins of the matrix switch. This will become apparent below.

The way that the grid is built in this example is that the rendering engine does a traversal operation on the tree 1200. In this particular example, the traversal operation is known as a "depth-first, left-to-right" traversal. This operation will layerize the nodes so that the leftmost track or source has the lowest priority and so on. Doing the above-mentioned traversal on tree 1200 (FIG. 12), the first node encountered is node 1204 which is associated with source A. This is the lowest priority track or source. A first row is defined for the grid and is associated with source A. After the first grid row is defined, a grid entry is made and represents the time period for which source A desires to be routed to the matrix switch's primary output.

Figure 13:
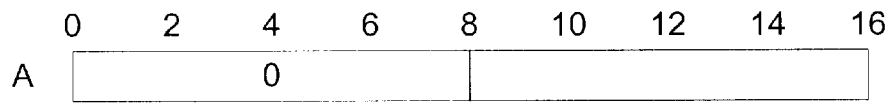

FIG. 13 shows the state of a grid 1300 after this first processing step. Notice that from time t=0–8, a "0" has been placed in the grid. The "0" represents the output pin of the matrix switch—in this case the primary output. Next, the traversal encounters node 1206 (FIG. 12) which is associated with source B. A second row is thus defined for the grid and is associated with source B. After the second grid row is defined, a grid entry is made and represents the time period for which source B desires to be routed to the matrix switch's primary output.

Figure 14:
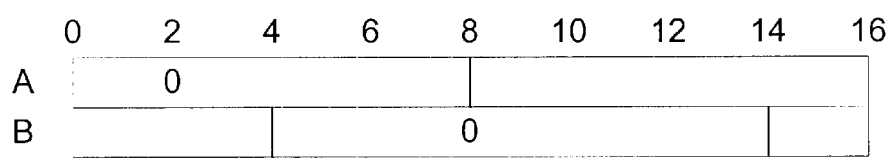

FIG. 14 shows the state of grid 1300 after this second processing step. Notice that from time t=4–14, a "0" has been placed in the grid. Notice at this point that something interesting has occurred which will be resolved below. Each of the layers has a common period of time (i.e. t=4–8) for which it desires to be routed to the matrix switch's primary output. However, because of the nature of the matrix switch, only one input can be routed to the primary output at a time.

Next, the traversal encounters node 1208 (FIG. 12) which is associated with source C. In this particular processing example, a rule is defined that sources on tracks are processed before transitions on the tracks are processed because transitions operate on two objects that are beneath them. A third row is thus defined for the grid and is associated with source C. After the third row is defined, a grid entry is made and represents the time period for which source C desires to be routed to the matrix switch's primary output.

Figure 15:
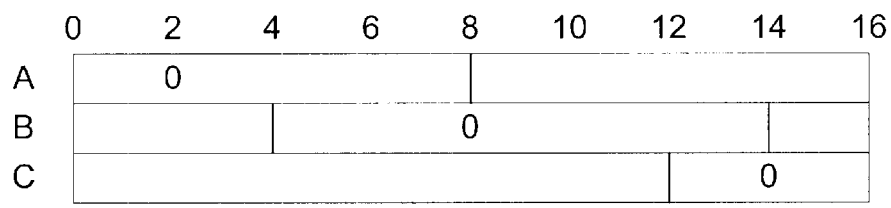

FIG. 15 shows the state of grid 1300 after this third processing step. Notice that from time t=12–16, a "0" has been placed in the grid. Next, the traversal encounters node 1210 (FIG. 12) which corresponds to the transition. Thus, a fourth row is defined in the grid and is associated with the transition. After the fourth row is defined, a grid entry is made and represents the time period for which the transition desires to be routed to the matrix switch's primary output.

Figure 16:
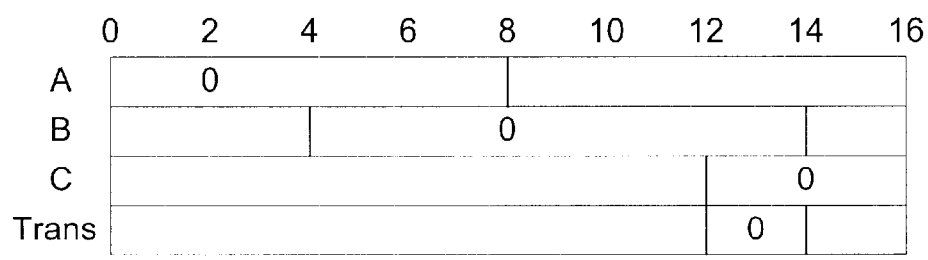

FIG. 16 shows the state of grid 1300 after this fourth processing step. Notice that from time t=12–14, a "0" has been placed in the grid for the transition entry. The transition is a special grid entry. Recall that the transition is programmed to operate on two inputs and provide a single output. Accordingly, starting at the transition entry in the grid and working backward, each of the entries corresponding to the same tree level are examined to ascertain whether they contain entries that indicate that they want to be routed to the output during the same time that the transition is to be routed to the output. If grid entries are found that conflict with the transition's grid entry, the conflicting grid entry is changed to a value to corresponds to an output pin that serves as an input to the transition element 1102 (FIG. 11). This is essentially a redirection operation. In the illustrated grid example, the transition first finds the level that corresponds to source C. This level conflicts with the transition's grid entry for the time period t=12–14. Thus, for this time period, the grid entry for level C is changed to a switch output that corresponds to an input for the transition element. In this example, a "2" is placed in the grid to signify that for this given time period, this input is routed to output pin 2. Similarly, continuing up the grid, the next level that conflicts with the transition's grid entry is the level that corresponds to source B. Thus, for the conflicting time period, the grid entry for level B is changed to a switch output that corresponds to an input for the transition element. In this example, a "1" is placed in the grid to signify that for this given time period, this input is routed to output pin 1 of the matrix switch.

FIG. 17 shows the state of the grid at this point in the processing. Next, a pruning function is implemented which removes any other lower priority entry that is contending for the output with a higher priority entry. In the example, the portion of A from t=4–8 gets removed because the higher priority B wants the output for that time.

FIG. 18 shows the grid with a cross-hatched area that signifies that portion of A's grid entry that has been removed.

At this point, the grid is in a state in which it can be used to program the matrix switch. The left side entries—A, B, C, and TRANS represent input pin numbers 0, 1, 2, and 3 (as shown) respectively, on the matrix switch shown in FIG. 11. The output pin numbers of the matrix switch are designated at 0, 1, and 2 both on the switch in FIG. 11 and within the grid in FIG. 18. As one proceeds through the grid, starting with source A, the programming of the matrix switch can be ascertained as follows: A is routed to output pin 0 of the matrix switch (the primary output) from t=0–4. From t=4–16, A is not routed to any output pins. From t=0–4, B is not routed to any of the output pins of the matrix switch. From t=4–12, B is routed to the primary output pin 0 of the matrix switch. From t=12–14, B is routed to output pin 1 of the matrix switch. Output pin 1 of the matrix switch corresponds to one of the input pins for the transition element 1102 (FIG. 11). From t=14–16, B is not routed to any of the output pins of the matrix switch. From t=0–12, C is not routed to any of the output pins of the matrix switch. From t=12–14, C is routed to output pin 2 of the matrix switch. Output pin 2 of the matrix switch corresponds to one of the input pins for the transition element 302 (FIG. 3). From t=12–14 the transition element (input pin 3) is routed to output pin 0. From t=14–16, C is routed to output pin 0 of the matrix switch.

As alluded to above, one of the innovative aspects of the matrix switch 308 is its ability to seek to any point in a source, without having to process the intervening content serially through the filter. Rather, matrix switch 308 identifies an appropriate transition point and dumps at least a subset of the intervening content, and continues processing from the seeked point in the content.

The ability of the matrix switch 308 to seek to any point in the media content gives rise to certain performance enhancement heretofore unavailable in computer implemented media processing systems. For example, generation of a filter graph by render engine 222 may take into account certain performance characteristics of the media processing system which will execute the user-defined media processing project. In accordance with this example implementation, render engine 222 may access and analyze the system registry of the operating system, for example, to ascertain the performance characteristics of hardware and/or software elements of the computing system implementing the media processing system, and adjust the filter graph construction to improve the perceived performance of the media processing system by the user. Nonetheless, there will always be a chance that a particular instance of a filter graph will not be able to process the media stream fast enough to provide the desired output at the desired time, i.e., processing of the media stream bogs down leading to delays at the rendering filter. In such a case, matrix switch 308 will recognize that it is not receiving media content at the appropriate project time, and may skip certain sections of the project in an effort to "catch-up" and continue the remainder of the project in real time. According to one implementation, when matrix switch 308 detects such a lag in processing, it will analyze the degree of the lag and issue a seek command to the source (through the source processing chain) to a future point in the project, where processing continues without processing any further content prior to the seeked point.

Thus, for the editing project depicted in FIG. 10, the processing described above first builds a data structure (i.e. data structure 1200 in FIG. 12) that represents the project in hierarchical space, and then uses this data structure to define or create another data structure that can be utilized to program the matrix switch.

Figure 19:
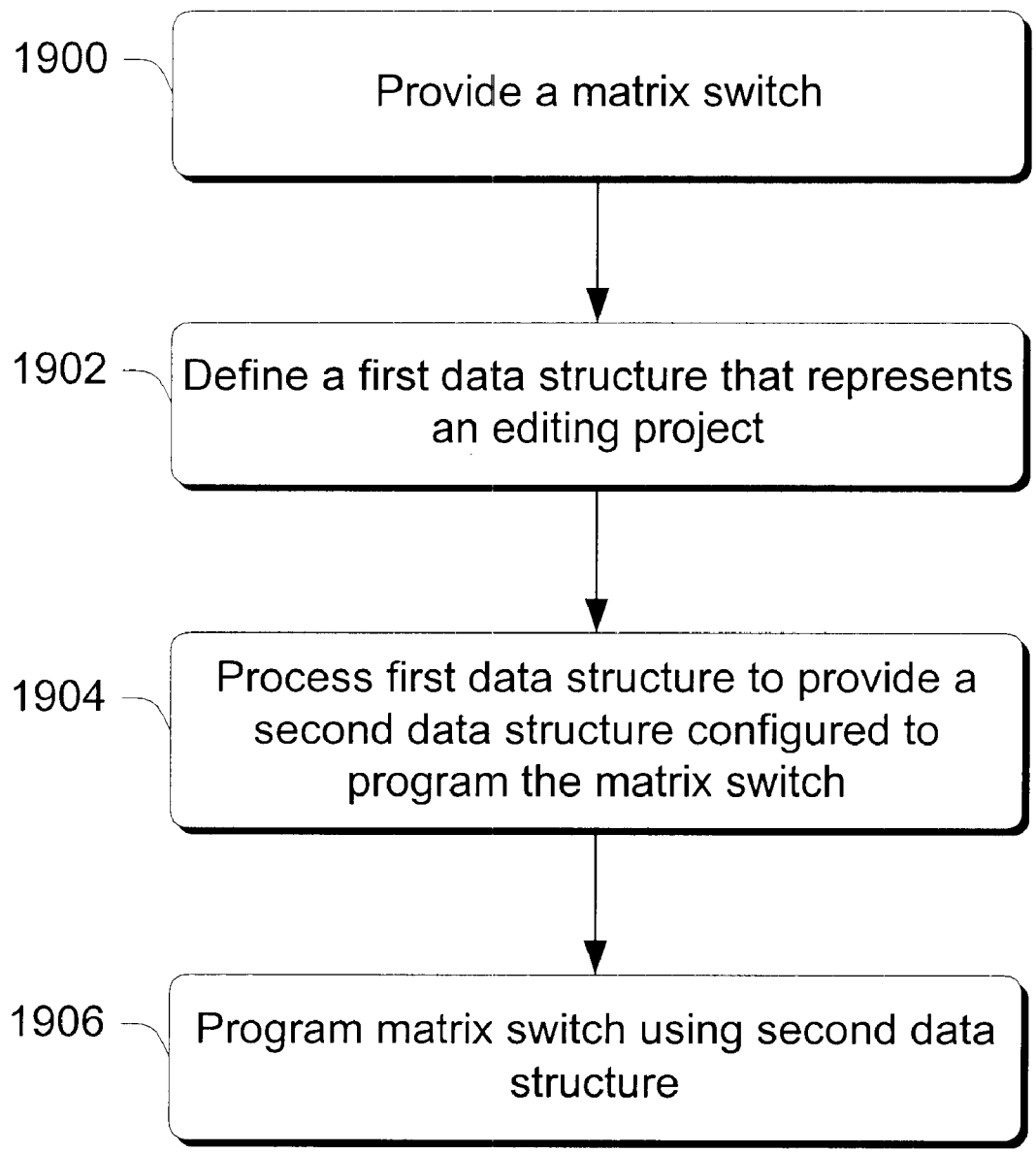
FIG. 19 is a flow chart of an example method for processing media content, in accordance with one described embodiment.

FIG. 19 is a flow diagram that describes steps in a method in accordance with the described embodiment. The method can be implemented in any suitable hardware, software, firmware, or combination thereof. In the illustrated and described embodiment, the method is implemented in software.

Step 1900 provides a matrix switch. An exemplary matrix switch is described above. Step 1902 defines a first data structure that represents the editing project. Any suitable data structure can be used, as will be apparent to those of skill in the art. In the illustrated and described embodiment, the data structure comprises a hierarchical tree structure having nodes that can represent tracks (having one or more sources), composites, transitions and effects. Step 1904 processes the first data structure to provide a second data structure that is configured to program the matrix switch. Any suitable data structure can be utilized to implement the second data structure. In the illustrated and described embodiment, a grid structure is utilized. Exemplary processing techniques for processing the first data structure to provide the second data structure are described above. Step 1906 then uses the second data structure to program the matrix switch.

Example Project with a Transition and an Effect

Figure 20:
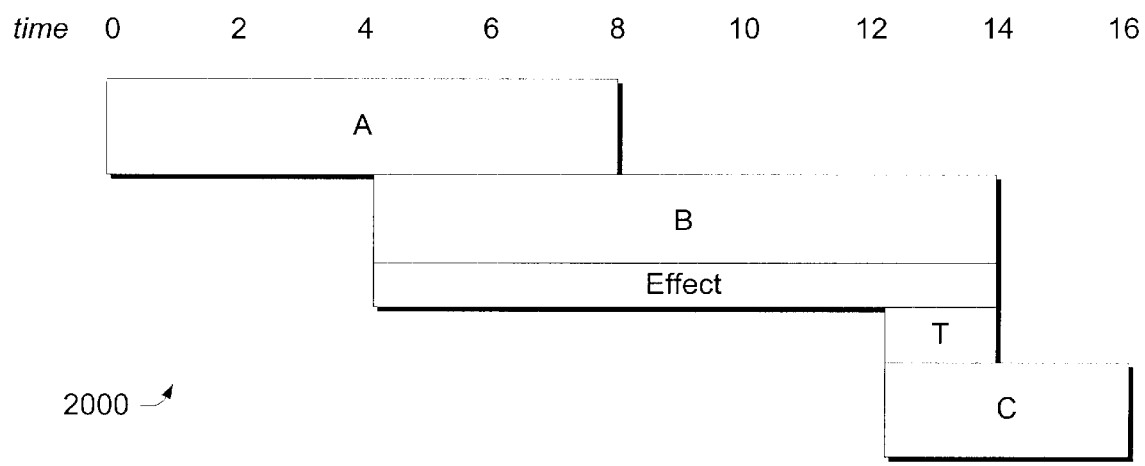
FIG. 20 illustrates an example project with a transition and an effect, in accordance with one described embodiment.

Consider project 2000 depicted in FIG. 20. In this project there are three tracks, each of which contains a source, i.e. source A, B and C. This project includes an effect applied on source B and a transition between sources B and C. The times are indicated as shown.

Figure 21:
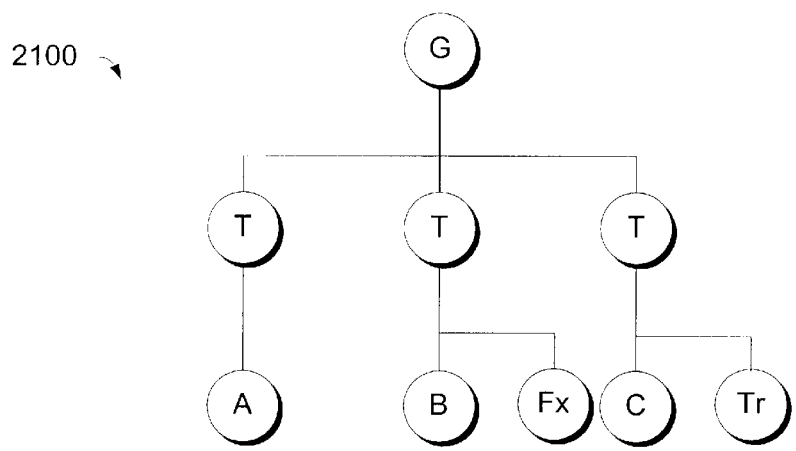
FIG. 21 shows an exemplary data structure in the form of a hierarchical tree that represents the project of FIG. 20.

As the user creates their project, a data structure representing the project is built. FIG. 21 shows an exemplary data structure in the form of a hierarchical tree 2100 that represents project 2000. There, the data structure includes three tracks, each of which contains one of the sources. The sources are arranged in the tree structure in the order of their priority, starting with the lowest priority source on the left and proceeding to the right. There is an effect (i.e. "Fx") that is attached to or otherwise associated with source B. Additionally, there is a transition attached to or otherwise associated with source C.

In building the grid for project 2000, the following rule is employed for effects. An effect, in this example, is a one-input/one-output object that is applied to one object—in this case source B. When the effect is inserted into the grid, it looks for any one object beneath it in priority that has a desire to be routed to the primary output of the matrix switch at the same time. When it finds a suitable object, it redirects that object's output from the matrix switch's primary output to an output associated with the effect.

Figures 22, 23, 24:
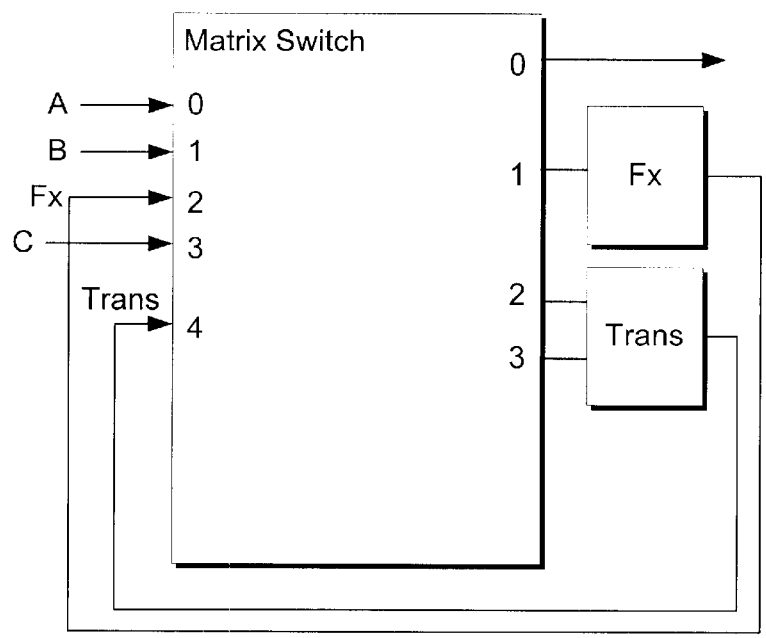
FIGS. 22 and 23 graphically illustrate an example matrix switch programming grid associated with the project of FIG. 20 at select points in time, according to one described embodiment.
FIG. 24 shows an example matrix switch dynamically generated and configured as the grid of FIGS. 22 and 23 was being processed, in accordance with one described embodiment.

As an example, consider FIG. 22 and the grid 2200. At this point in the processing of tree 2100, the rendering engine has incorporated entries in the grid corresponding to sources A, B and the effect. It has done so by traversing the tree 2100 in the above-described way. In this example, the effect has already looked for an object beneath it in priority that is competing for the primary output of the matrix switch. It found an entry for source B and then redirected B's grid entry to a matrix switch output pin that corresponds to the effect—here output pin 1.

As the render engine 222 completes its traversal of tree 2100, it completes the grid. FIG. 23 shows a completed grid 2200. Processing of the grid after that which is indicated in FIG. 22 takes place substantially as described above with respect to the first example. Summarizing, this processing though: after the effect is entered into the grid and processed as described above, the traversal of tree 2100 next encounters the node associated with source C. Thus, a row is added in the grid for source C and an entry is made to indicate that source C desires the output from t=12–16. Next, the tree traversal encounters the node associated with the transition. Accordingly, a row is added to the grid for the transition and a grid entry is made to indicate that the transition desires the output from t=12–14. Now, as described above, the grid is examined to find two entries, lower in priority than the transition and located at the same tree level as the transition, that compete for the primary output of the matrix switch. Here, those entries correspond to the grid entries for the effect and source C that occur from t=12–14. These grid entries are thus redirected to output pins of the matrix switch 308 that correspond to the transition—here pins 2 and 3 as indicated. Next, the grid is pruned which, in this example, removes a portion of the grid entry corresponding to source A for t=4–8 because of a conflict with the higher-priority entry for source B.

FIG. 24 shows the resultant matrix switch that has been built and configured as the grid was being processed above. At this point, the grid can be used to program the matrix switch. From the grid picture, it is very easy to see how the matrix switch 308 is going to be programmed. Source A will be routed to the matrix switch's primary output (pin 0) from t=0–4; source B will be redirected to output pin 1 (effect) from t=4–14 and the effect on B will be routed to the output pin 0 from t=4–12. From t=12–14, the effect and source C will be routed to output pins corresponding to the transition (pins 2 and 3) and, accordingly, during this time the transition (input pin 4) will be routed to the primary output (output pin 0) of the matrix switch. From t=14–16, source C will be routed to the primary output of the matrix switch.

It will be appreciated that as the software, in this case the render engine 222, traverses the tree structure that represents a project, it also builds the appropriate graphs and adds the appropriate filters and graphs to the matrix switch. Thus, for example, as the render engine 222 encounters a tree node associated with source A, in addition to adding an entry to the appropriate grid, the software builds the appropriate graphs (i.e. collection of linked filters), and associates those filters with an input of the matrix switch. Similarly, when the render engine 222 encounters an effect node in the tree, the software obtains an effect object or filter and associates it with the appropriate output of the matrix switch. Thus, in the above examples, traversal of the tree structure representing the project also enables the software to construct the appropriate graphs and obtain the appropriate objects and associate those items with the appropriate inputs/outputs of the matrix switch 308. Upon completion of the tree traversal and processing of the grid, an appropriate matrix switch has been constructed, and the programming (i.e. timing) of inputs to outputs for the matrix switch has been completed.

Treatment of "blanks" in a Project

There may be instances in a project when a user leaves a blank in the project time line. During this blank period, no video or audio is scheduled for play.

Figure 25:
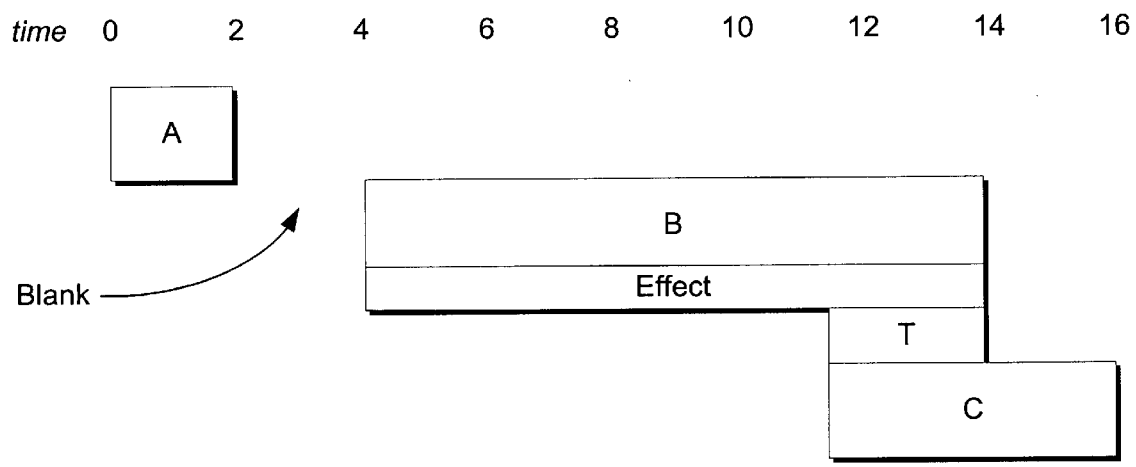
FIG. 25 shows an exemplary project in accordance with one described embodiment.

FIG. 25 shows a project that has such a blank incorporated therein. If there is such a blank left in a project, the software is configured to obtain a "black" source and associate the source with the matrix switch at the appropriate input pin. The grid is then configured when it is built to route the black source to the output at the appropriate times and fade from the black (and silent) source to the next source at the appropriate times. The black source can also be used if there is a transition placed on a source for which there is no additional source from which to transition.

Audio Mixing

In the examples discussed above, sources comprising video streams were discussed. In those examples, at any one time, only two video streams were combined into one video stream. However, each project can, and usually does contain an audio component. Alternately, a project can contain only an audio component. The audio component can typically comprise a number of different audio streams that are combined. The discussion below sets forth but one way of processing and combining audio streams.

In the illustrated example, there is no limit on the number of audio streams that can be combined at any one time.

Figure 26:
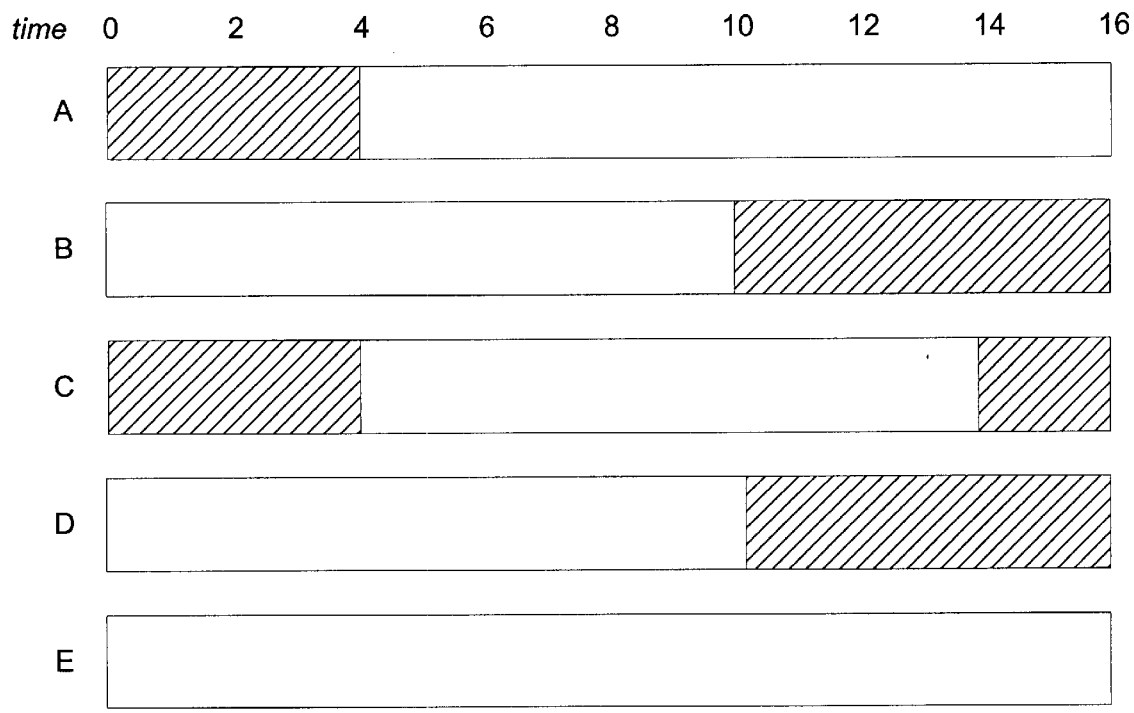
FIG. 26 graphically illustrates an example audio editing project, according to one described embodiment.

Suppose, for example, there is an audio project that comprises 5 tracks, A–E. FIG. 26 shows an exemplary project. The shaded portions of each track represent the time during which the track is not playing. So, for example, at t=0–4, tracks B, D, and E are mixed together and will play. From t=4–10, tracks A–E are mixed together and will play, and the like.

Figure 27:
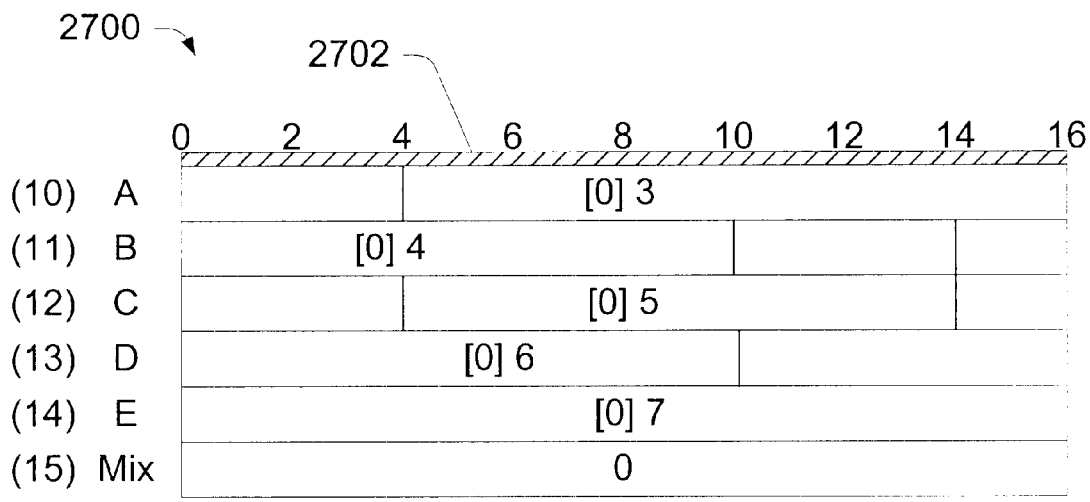
FIG. 27 depicts an example matrix switch programming grid associated with the project of FIG. 26.

FIG. 27 shows the grid for this project at 2700. Since we are dealing with this composition now, all of the effects and transitions including the audio mixing are only allowed to affect things in this composition. Thus, there is the concept of a boundary 2702 that prevents any actions or operations in this composition from affecting any other grid entries. Note that there are other entries in the grid and that the presently-illustrated entries represent only those portions of the project that relate to the audio mixing function.

Grid 2700 is essentially set up in a manner similar to that described above with respect to the video projects. That is, for each track, a row is added to the grid and a grid entry is made for the time period during which the source on that track desires to be routed to the primary output of the matrix switch. In the present example, grid entries are made for sources A–E. Next, in the same way that a transition or effect was allocated a row in the grid, a "mix" element is allocated a row in the grid as shown and a grid entry is made to indicate that the mix element desires to be routed to the primary output of the matrix switch for a period of time during which two or more sources compete for the matrix switch's primary output. Note that in this embodiment, allocation of a grid row for the mix element can be implied. Specifically, whereas in the case of a video project, overlapping sources simply result in playing the higher priority source (unless the user defines a transition between them), in the audio realm, overlapping sources are treated as an implicit request to mix them. Thus, the mix element is allocated a grid row any time there are two or more overlapping sources.

Figure 28:
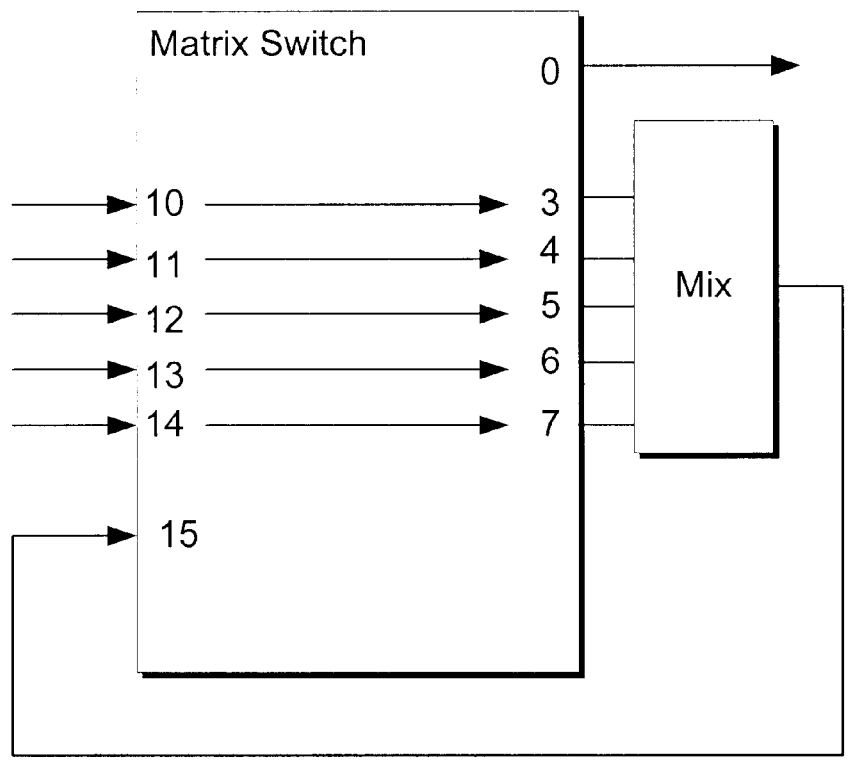
FIG. 28 shows an example matrix switch dynamically generated and configured in accordance with the programming grid of FIG. 27 to perform the project of FIG. 26, according to one described embodiment.

Once the mix element is allocated into the grid, the grid is processed to redirect any conflicting source entries to matrix switch output pins that correspond to the mix element. In the above case, redirection of the grid entries starts with pin 3 and proceeds through to pin 7. The corresponding matrix switch is shown in FIG. 28. Notice that all of the sources are now redirected through the mix element which is a multi-input/one output element. The mix element's output is fed back around and becomes input pin 15 of the matrix switch. All of the programming of the matrix switch is now reflected in the grid 2700. Specifically, for the indicated time period in the grid, each of the sources is routed to the mix element which, in turn, mixes the appropriate audio streams and presents them to the primary output pin 0 of the matrix switch.

Compositions

There are situations that can arise when building an editing project where it would be desirable to apply an effect or a transition on just a subset of a particular project or track. Yet, there is no practicable way to incorporate the desired effect or transition. In the past, attempts to provide added flexibility for editing projects have been made in the form of so called "bounce tracks", as will be appreciated and understood by those of skill in the art. The use of bounce tracks essentially involves processing various video layers (i.e. tracks), writing or moving the processed layers or tracks to another location, and retrieving the processed layers when later needed for additional processing with other layers or tracks. This type of processing can be slow and inefficient.

To provide added flexibility and efficiency for multimedia editing projects, the notion of a composite or composition is introduced. A composite or composition can be considered as a representation of an editing project as a single track. Recall that editing projects can have one or more tracks, and each track can be associated with one or more sources that can have effects applied on them or transitions between them. In addition, compositions can be nested inside one another.

Example Project with Composite

Figure 29:
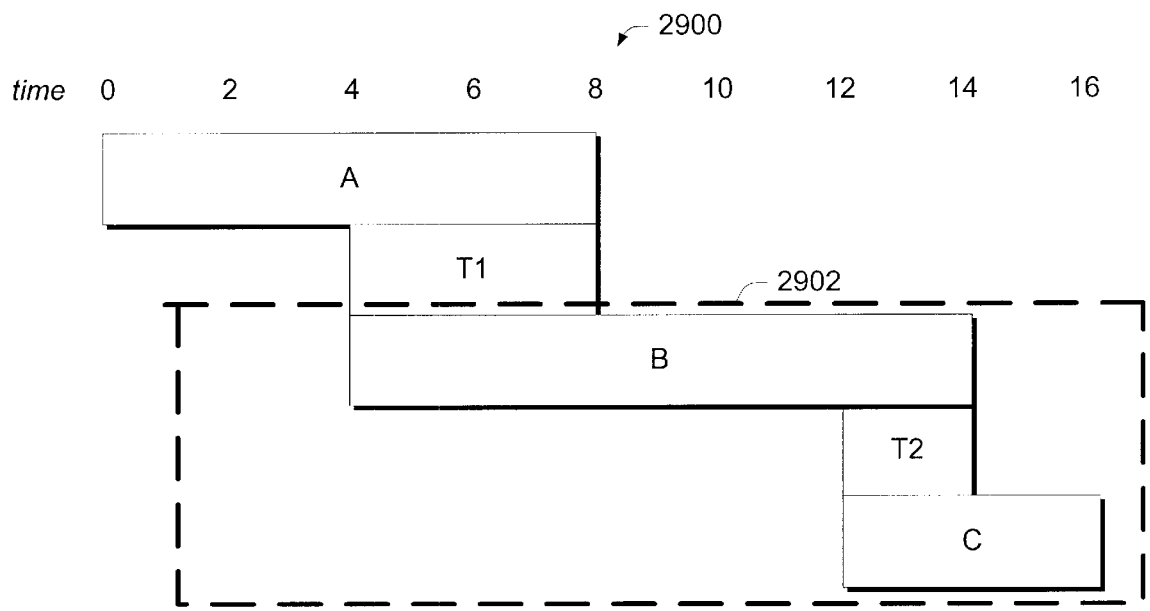
FIG. 29 illustrates an exemplary media processing project incorporating another media processing project as a composite, according to yet another described embodiment.

Consider, for example, FIG. 29 which illustrates an exemplary project 2900 having a composition 2902. In this example, composition 2902 comprises sources B and C and a transition between B and C that occurs between t=12–14. This composition is treated as an individual track or layer. Project 2900 also includes a source A, and a transition between source A and composition 2902 at t=4–8. It will be appreciated that compositions can be much more complicated than the illustrated composition, which is provided for exemplary purposes only. Compositions are useful because they allow the grouping of a particular set of operations on one or more tracks. The operation set is performed on the grouping, and does not affect tracks that are not within the grouping. To draw an analogy, a composition is similar in principle to a mathematical parenthesis. Those operations that appear within the parenthesis are carried out in conjunction with those operations that are intended to operate of the subject matter of the parenthesis. The operations within the parenthesis do not affect tracks that do not appear within the parenthesis.

Figure 30:
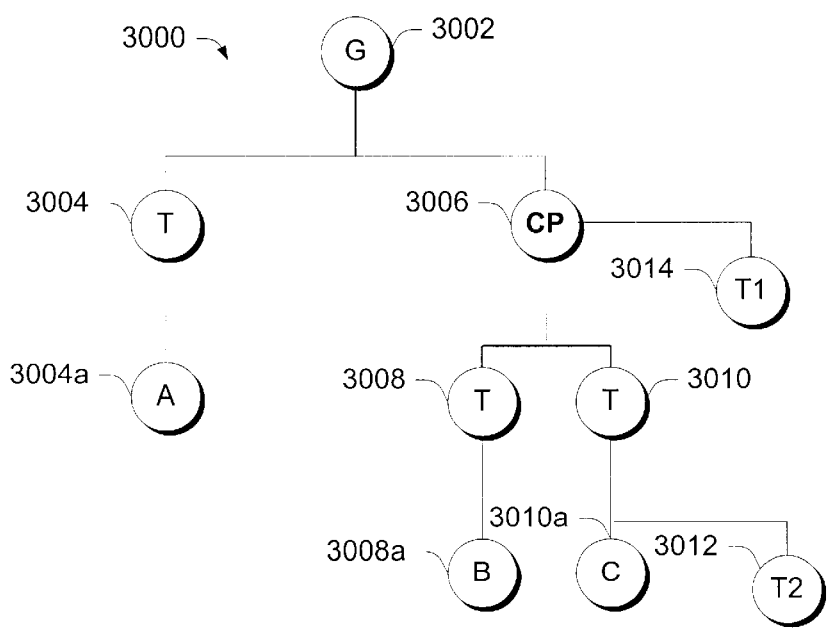
FIG. 30 graphically illustrates an example data structure in the form of a hierarchical tree structure that represents the project of FIG. 29.

In accordance with the processing that is described above in connection with FIG. 19, a first data structure is defined that represents the editing project. FIG. 30 shows an exemplary data structure 3000 in the form of a hierarchical tree structure. In this example, group node 3002 includes two children—track node 3004 and composite node 3006. Track node 3004 is associated with source A. Composite node 3006 includes two children—track nodes 3008 and 3010 that are respectively associated with sources B (3008a) and C (3010a). A transition T2 (3012) is applied on source C and a transition T1 (3014) is applied on composition 3006.

Next, data structure 3000 is processed to provide a second data structure that is configured to program the matrix switch. Note that as the data structure is being programmed, a matrix switch is being built and configured at the same time. In this example, the second data structure comprises a grid structure that is assembled in much the same way as was described above. There are, however, some differences and, for purposes of understanding, the complete evolution of the grid structure is described here. In the discussion that follows, the completed matrix switch is shown in FIG. 38.

When the rendering engine initiates the depth-first, left-to-right traversal of data structure 3000, the first node it encounters is track node 3004 which is associated with source A. Thus, a first row of the grid is defined and a grid entry is made that represents the time period for which source A desires to be routed to the matrix switch's primary output pin.

Figure 31:
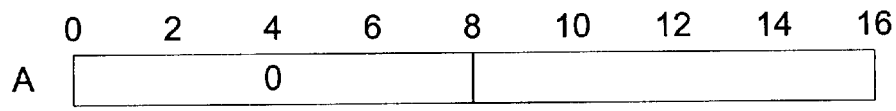

FIG. 31 shows the state of a grid 3100 after this first processing step. Next the traversal of data structure 3000 encounters the composite node 3006. The composite node is associated with two tracks—track 3008 and track 3010. Track 3008 is associated with source B. Accordingly, a second row of the grid is defined and a grid entry is made that represents the time period for which source B desires to be routed to the matrix switch's primary output pin. Additionally, since B is a member of a composition, meta-information is contained in the grid that indicates that this grid row defines one boundary of the composition. This meta-information is graphically depicted with a bracket that appears to the left of the grid row.

Figure 32:
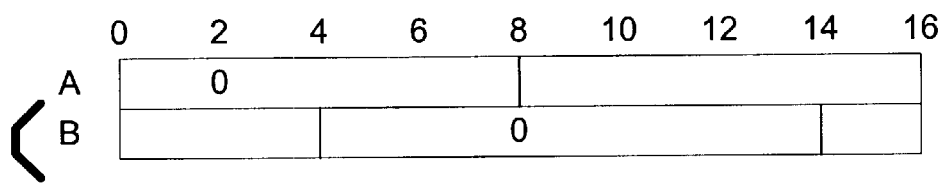

FIG. 32 shows the state of grid 3100 after this processing step. Next, the traversal of data structure 3000 encounters node 3010 which is associated with source C. Thus, a third row of the grid is added and a grid entry is made that represents the time period for which source C desires to be routed to the matrix switch's primary output pin.

Figure 33:
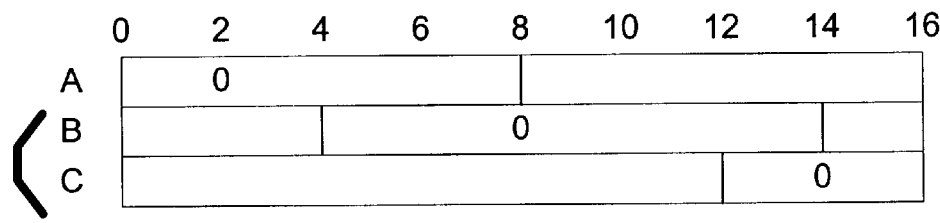

FIG. 33 shows the state of grid 3100 after this processing step. Notice that the bracket designating the composition now encompasses the grid row associated with source C. The traversal next encounters node 3012 which is the node associated with the second transition T2. Thus, as in the above example, a grid row is added for the transition and a grid entry is made that represents the time period for which the transition desires to be routed to the matrix switch's primary output pin.

Figure 34:
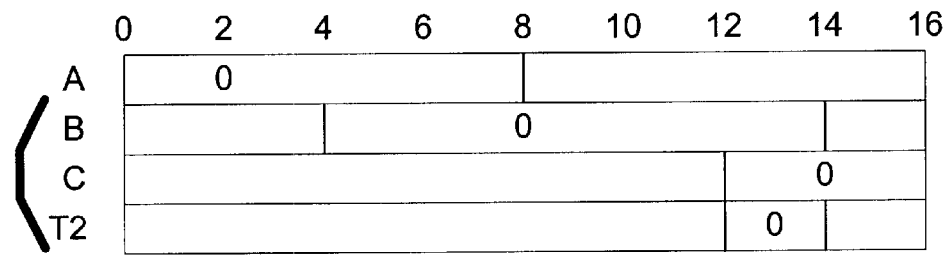

FIG. 34 shows the state of grid 3100 after this processing step. Notice that the bracket designating the composition is now completed and encompasses grid row entries that correspond to sources B and C and the transition between them. Recall from the examples above that a transition, in this example, is programmed to operate on two inputs and provide a single output. In this instance, and because the transition occurs within a composition, the transition is constrained by a rule that does not allow it to operate on any elements outside of the composition. Thus, starting at the transition entry and working backward through the grid, entries at the same tree level and within the composition (as designated by the bracket) are examined to ascertain whether they contain entries that indicate that they want to be routed to the output during the same time that the transition is to be routed to the output. Here, both of the entries for sources B and C have portions that conflict with the transition's entry. Accordingly, those portions of the grid entries for sources B and C are redirected or changed to correspond to output pins that are associated with a transition element that corresponds to transition T2.

Figures 35, 36, 37:
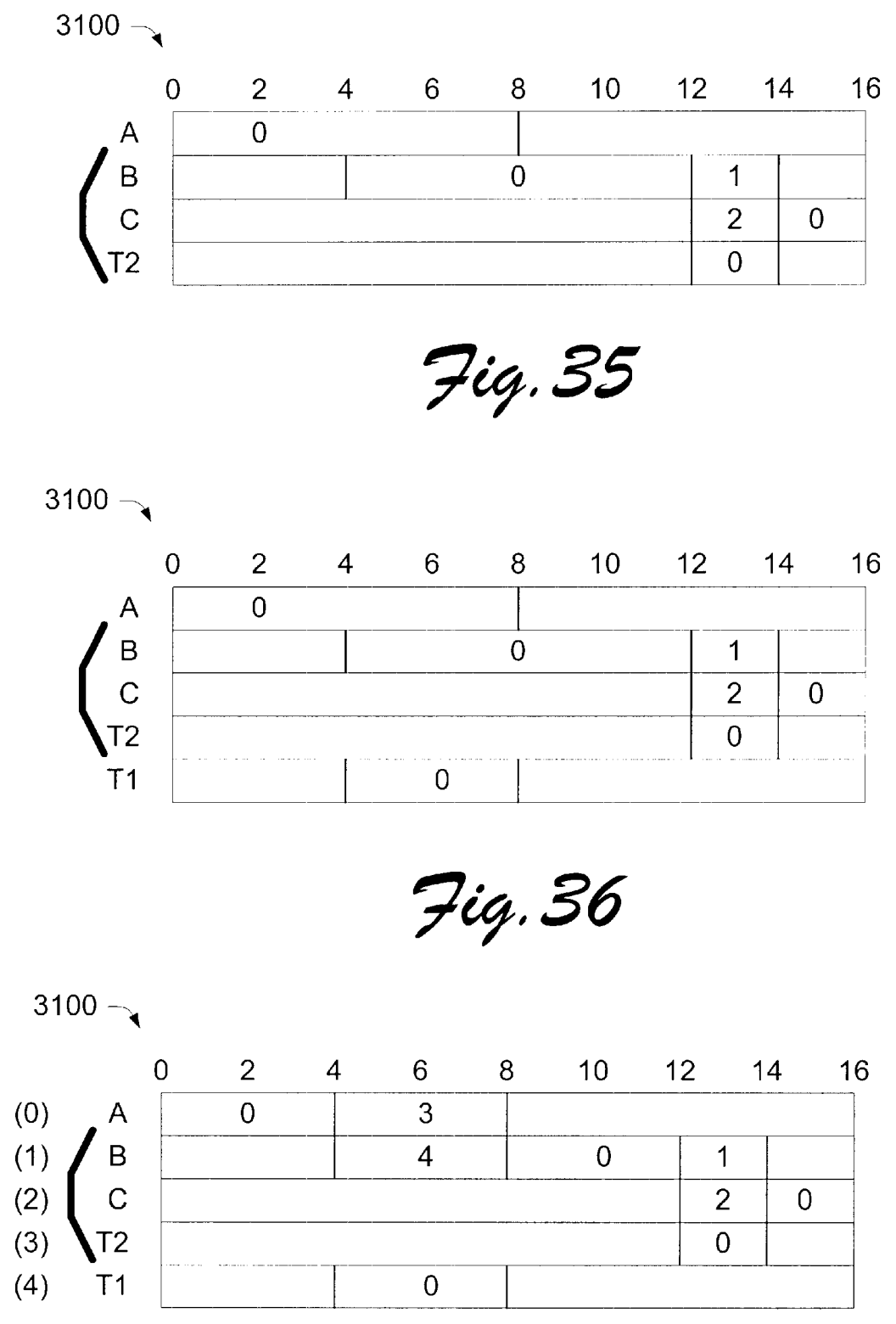

FIG. 35 shows the state of grid 3100 after this processing step. The traversal next encounters node 3014 which is the node that is associated with the transition that occurs between source A and composition 2902 (FIG. 29). Processing of this transition is similar to processing of the transition immediately above except for the fact that the transition does not occur within the composition. Because the transition occurs between the composition and another source, one of the inputs for the transition will be the composition, and one of the inputs will be source A (which is outside of the composition). Thus, a grid row is added for this transition and a grid entry is made that represents the time period for which the transition desires to be routed to the matrix switch's primary output pin.

FIG. 36 shows the state of grid 3100 after this processing step. At this point then, the grid is examined for entries that conflict with the entry for transition T1. One conflicting grid entry is found for the row that corresponds to source B (inside the composition) and one that corresponds to source A (outside the composition). Accordingly, those portions of the grid row that conflict with transition T1 are changed or redirected to have values that are associated with output pins of the matrix switch that are themselves associated with a transition element T1. In this example, redirection causes an entry of "3" and "4" to be inserted as shown.

FIG. 37 shows the state of grid 3100 after this processing step. If necessary, a pruning operation would further ensure that the grid has no competing entries for the primary output of the matrix switch. The associated input pin numbers of the matrix switch are shown to the left of grid 3100.

FIG. 38 shows a suitably configured matrix switch that has been build in accordance with the processing described above. Recall that, as data structure 3000 (FIG. 30) is processed by the rendering engine, a matrix switch is built and configured in parallel with the building and processing of the grid structure that is utilized to program the matrix switch. From the matrix switch and grid 3100 of FIG. 37, the programming of the switch can be easily ascertained.

Figure 38A:
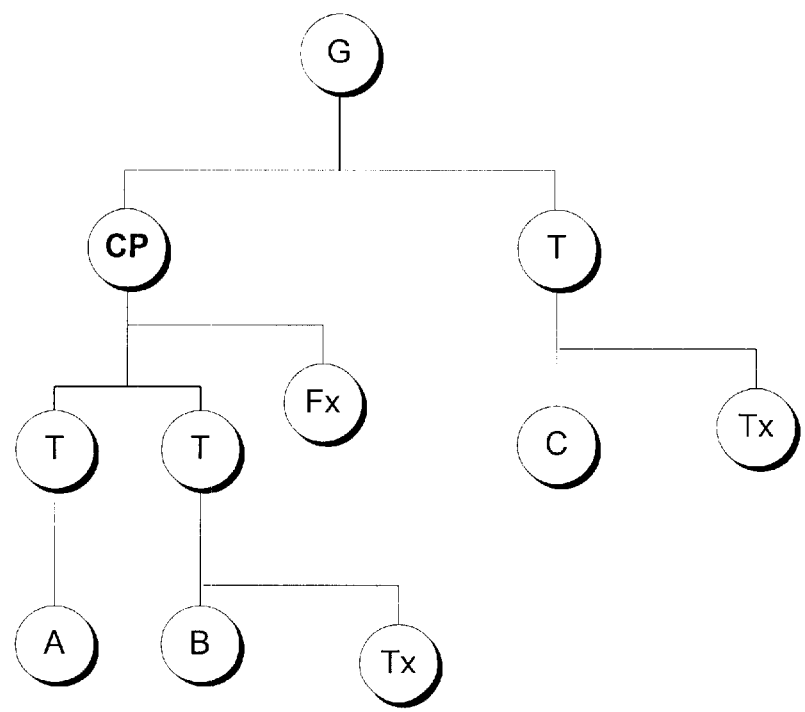
FIG. 38a graphically illustrates an example data structure in the form of a hierarchical tree structure that represents a project that is useful in understanding composites in accordance with the described embodiments.
Figure 38:
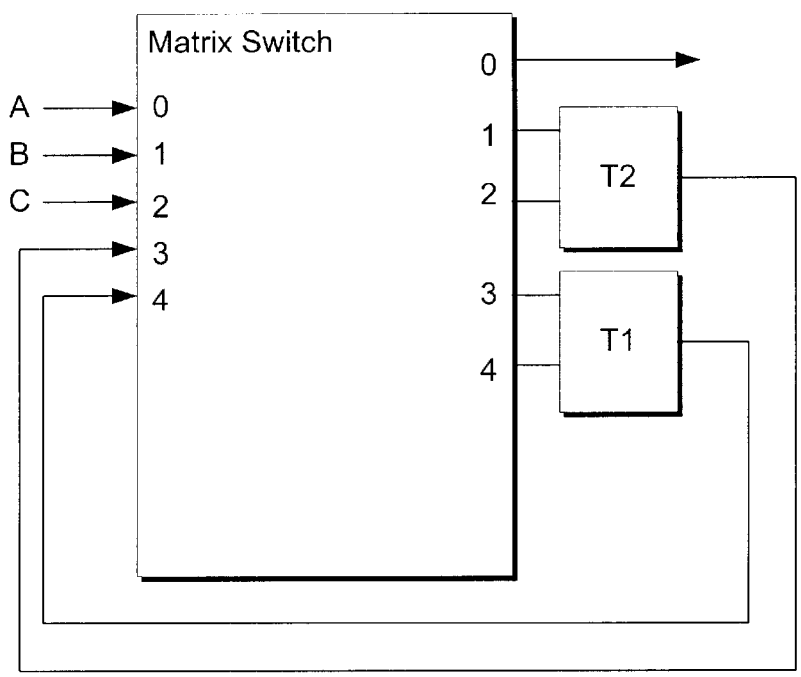
FIG. 38 illustrates an example matrix switch suitable for use in the media processing project of FIG. 29, according to one described embodiment.

FIG. 38a shows an exemplary data structure that represents a project that illustrates the usefulness of composites. In this example, the project can mathematically be represented as follows:

(Fx-noisy (A Tx-Blend B)) Tx-Blend C

Here, an effect (noisy) is applied to A blended with B, the result of which is applied to a blend with C. The composite in this example allows the grouping of the things beneath it so that the effect (noisy), when it is applied, is applied to everything that is beneath it. Notice that without the composite node, there is no node where an effect can be applied that will affect (A Tx-Blend B). Hence, in this example, operations that appear within the parenthesis are carried out on tracks that appear within the parenthesis. Those operations do not affect tracks that are not within the parenthesis.

Figure 39:
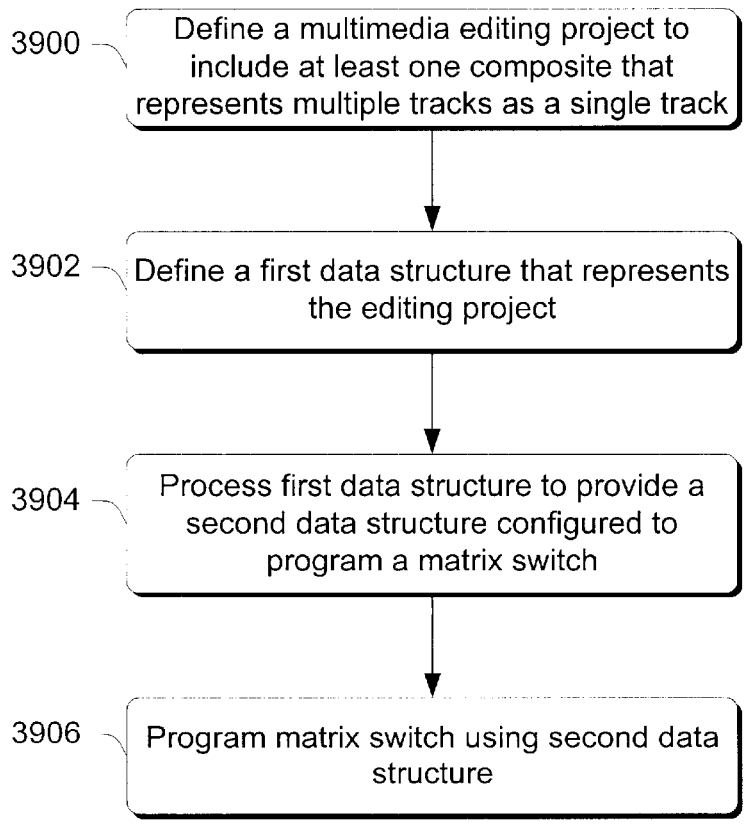
FIG. 39 is a flow diagram that describes steps in a method in accordance with one described embodiment.

FIG. 39 is a flow diagram that described steps in a method in accordance with one embodiment. The method can be implemented in any suitable hardware, software, firmware, or combination thereof. In the presently-described example, the method is implemented in software.

Step 3900 defines a multimedia editing project that includes at least one composite. The composite represents multiple tracks as a single track for purposes of the processing described just below. It is important to note that, in the processing described just below, and because of the use of composites, the extra processing that is required by bounce tracks is avoided (i.e. operating on two tracks, moving the operation result to another location, and retrieving the operation result when later needed). This reduces the processing time that is required to render a multi-media project. Step 3902 defines a first data structure that represents the editing project. Any suitable data structure can be utilized. In the present example, a data structure in the form of a hierarchical tree is utilized. An exemplary tree is shown in FIG. 30. Step 3904 processes the first data structure to provide a second data structure that is configured to program a matrix switch. In the illustrated example, the second data structure comprises a grid structure. Exemplary processing is described in the context of FIGS. 30–37. Step 3906 then programs the matrix switch using the second data structure.

Audio Rate Conversion

Having introduced various architectural and implementation elements of the present invention, above, attention is now drawn to FIGS. 40–43, wherein another aspect of the illustrated embodiment is presented. As introduced above, in order to pass media content through effect and/or transition filter(s), each of the processing chains must supply content to these effect and/or transition objects at an agreed upon sample rate. Often the sample rate is set by a user and is dictated, for example, by the granularity with which they endeavor to edit the media content. To ensure that potentially multiple sources of audio content is received by the effect and/or transition filters at the same rate, filter graphs often incorporate audio rate converter objects in audio processing chains, to modify the audio rate of some source to a rate defined by the user in the development project. Most conventional audio converter objects simply divide the sample size by the sample rate to generate a uniform packet size. This, however, has the potential for non-real number packet sizes. The conventional solution to such a problem was to simply truncate the non-integer portion of the resultant sample, creating an accumulating rounding error that grows increasingly large as media content is passed through the converter object, which, when it grows too large will reduce the perceived performance of the system by the end-user.

To overcome this limitation, the render engine 222 of the present invention exposes an innovative audio conversion object. As will be described below, the audio conversion object converts the received audio stream into a user-defined repeating sequence of packets without generating an accumulating rounding error. In accordance with one aspect of the present invention, any rounding error is dealt with locally, within each sequence of packets, thereby reducing the potential for any performance degradation experienced by the user. Moreover, the audio conversion object facilitates predictable, random seeks into this repeating sequence of non-uniform audio packets, while maintaining the calculated sample rate.

FIG. 40 illustrates a block diagram of an audio conversion object, according to one embodiment of the present invention. In accordance with the illustrated example embodiment of FIG. 40, audio conversion object 4000 is depicted comprising control logic 4002, an input buffer 4004, an audio packet engine 4006 and an output buffer 4008, each coupled as depicted. In addition, audio packet engine 4006 is depicted comprising packet generation function 4010 and seek function 4012. It is to be appreciated that, although illustrated as a block diagram in accordance with a hardware paradigm, audio conversion object 4000 may well be implemented in software. Indeed, as introduced above in accordance with one example implementation of the present invention, the objects (e.g., filters) exposed by render engine 222 are software objects (e.g., component object model (COM)). Accordingly, the inventive scope of the present invention may well be implemented in a number of ways.

Control logic 4002 selectively invokes the features of audio packet engine 4006 to generate a repeating sequence of audio packets from the received stream of audio content for use in audio processing by the filter graph and/or to facilitate predictable, random seeks to specific audio content while maintaining the user-defined sample rate. According to one implementation, control logic 4002 is responsive to a higher level application such as, for example, a multimedia control application, a multimedia editing application, and the like, to set audio sample rate, frame rates, etc. In addition, control logic 4002 is responsive to other filters such as, e.g., the matrix switch filter 308 to set frame rate, sample rate etc. As used herein, control logic 4002 is intended to represent a wide variety of control means known in the art, e.g., a controller, a microprocessor, a programmable logic device (PLD), field programmable gate array (FPGA), and the like. Alternatively, control logic 4002 may be implemented by a series of executable instructions which, when executed by a host computing device, implement the features described herein.

Audio packet engine 4006 is selectively invoked by control logic 4002 to generate a repeating sequence of audio packets from a received stream of audio content for use in processing by the filter graph, and also to facilitate predictable, random seeks to specified audio content within the repeating sequence of audio packets. In this regard, audio packet engine 4006 is depicted comprising packet generation function 4010 and random seek function 4012. The packet generation function 4010 receives an indication from the source as to the sample rate. In addition, control logic 4002 may provide an indication of (1) any user defined change to the sample rate and/or (2) the desired number of packets per sample. Default values may be substituted if the user does not provide any indication of the above. As will be discussed in greater detail below, packet generation function 4012 calculates packet size by dividing the sample rate by the number of packets per second desired by the user (i.e., as received from the user interface via control logic 4002). If a non-integer number is returned, the non-integer portion is truncated for all but one packet (e.g., the last packet) of the sequence, where a value of one (1) sample is added to the this packet. In this way, rounding errors that might otherwise accumulate and become noticeable to a user over a long period of time are localized within each of the repeating sequence of packets and, thus, are not perceived by the user. To foster better understanding of the innovative feature of the packet generation function, reference is drawn to FIG. 41, which graphically illustrates this aspect of the invention.

In accordance with the illustrated example of FIG. 41, a source provides audio content 4102 to audio conversion object 4000 at 10,000 samples per second. In addition, audio conversion object 4000 receives an indication (e.g., from a user) to convert the received audio stream to a rate of (for example) three (3) packets per second. Those skilled in the art will appreciate that a conventional audio conversion object might well perform a straight conversion by dividing the received samples by the requested frame rate. Such a conventional approach would result in a packet size of 3,333.333 samples per packet. As indicated above, rather than simply truncate the remainder from this quotient, a practice of conventional audio conversion objects which would propagate error to subsequent samples, the packet generation function 4010 localizes this rounding error to one packet (e.g., 4112) of each repeating sequence of packets (i.e., three packets 4108–4112 in this example). As introduced above, audio conversion object truncates the remainder from the quotient of all but one packet (e.g., the first N−1 packets of the sequence (4108, 4110)), and adds one (1) sample to this packet (e.g., the last packet (N) of the sequence (4112) to localize the rounding error to within the three packet sequence. In this way, audio conversion object 4000 localizes any rounding error to each sequence. Packet size imbalances of one sample, as used herein, will be virtually undetectable by the end-user. Further, although the illustrated example depicts a method wherein the rounding error is localized in the last packet of the sequence, those skilled in the art will appreciate that the rounding error may well be localized in any of the packets of the sequence (e.g., the middle packet of a three packet example sequence of FIG. 41) without deviating from the spirit and scope of this aspect of the invention.

Returning to FIG. 40, audio packet engine 4006 is depicted comprising a random seek function 4012 facilitating predictable, random seeks to any location in the converted audio sequence, while maintaining the imbalanced packet size and error localization features introduced above. The difficulty in facilitating random seeks into a stream of non-uniform packets arises when it is necessary maintain predictability as to the size of the packet and the location of the packet within the sequence. Thus, when a random seek is received, an instance of random seek function 4012 is invoked to facilitate predictable, random seeks into the converted audio content. As will be described more fully below, random seek function 4012 calculates the sample size of the packet seeked into, and makes a determination of which packet within the sequence has been seeked into. Given this information, audio packet engine 4006 can supply an accurate, continuous packet stream from the seeked packet. Each of these aspects of the invention will be developed in more detail below.

Figure 42:
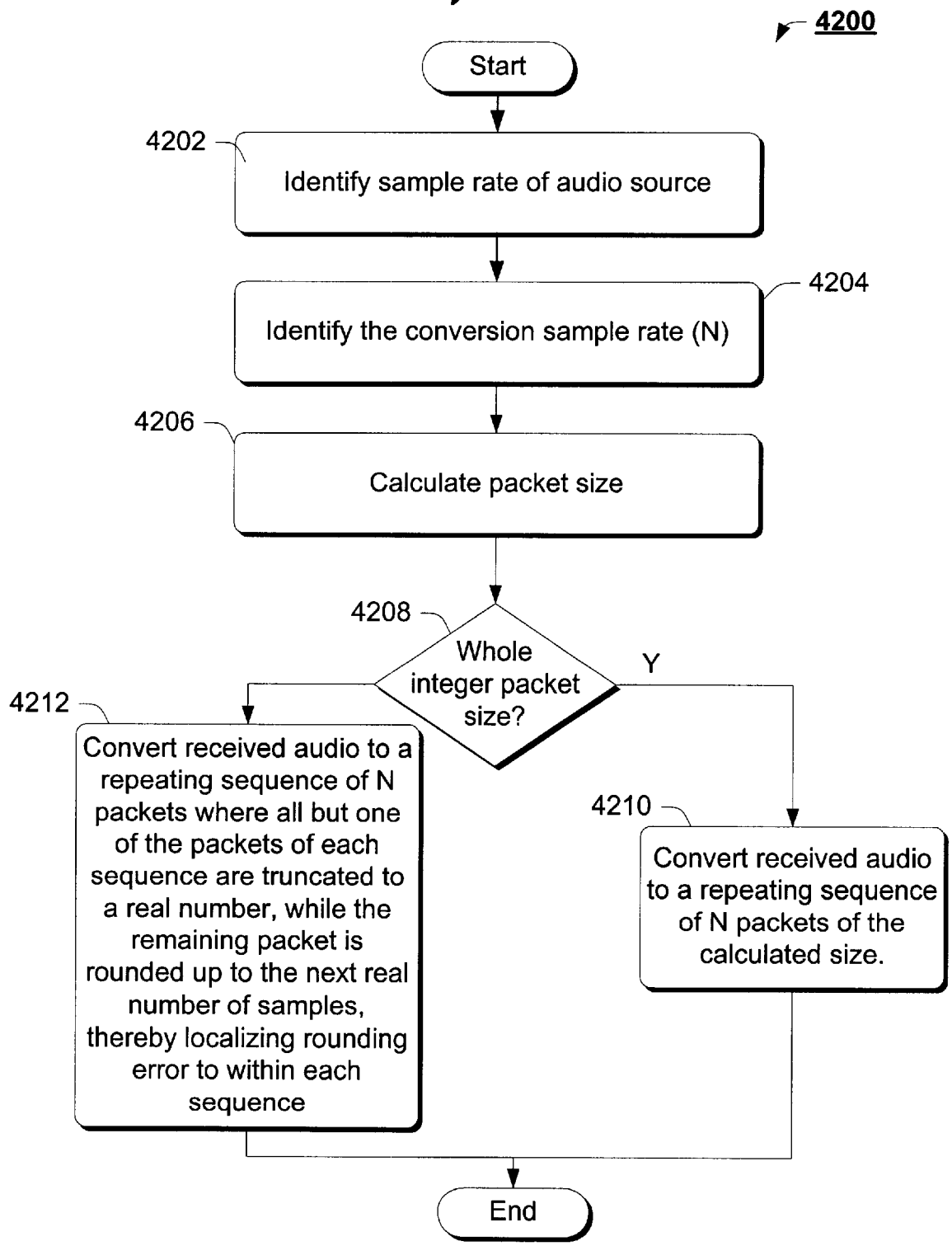
FIG. 42 illustrates a flow chart of an example method of packetizing audio content, in accordance with one aspect of the present invention.

FIG. 42 illustrates a flow chart of an example method of converting audio content to a user defined sample rate, in accordance with one aspect of the present invention. In accordance with the illustrated example embodiment of FIG. 42, the method of converting audio content sample rate begins with block 4202 wherein packet generation function 4010 is invoked to identify the sample rate of audio content from the source. According to one implementation, this information is provided to the audio conversion object 4000 from the source. In other instances, packet generation function 4010 queries the source for the information.

In block 4204, packet generation function 4010 determines the requested sample rate (N) for the conversion. More particularly, as described above, control logic 4002 receives an indication of a requested sample size from an end-user, or from another filter (e.g., matrix switch filter 308) to facilitate audio mixing or other transforms with other audio streams at the same sample rate.

Given the audio rate from the source, and the requested sample rate, packet generation function 4010 calculates the packet size for each packet within the new sample rate, block 4206. As introduced above, packet generation function 4010 divides the default sample rate of the audio content by the requested sample rate to obtain an initial packet size. If the initial packet size computed is an integer, all of the packets within the repeating sequence of packets generated by the packet engine will be of the same size. Accordingly, packet generation function 4010 receives the source stream of audio and converts it to the requested sample rate of the calculated size, block 4210.

If, however, the initial packet size does not resolve to an integer (block 4208), packet generation function 4010 truncates the remainder from the all but one packet (e.g., the first N−1 packets) of the repeating sequence, then adds one (1) sample to this packet (e.g., the last packet (N)) of the sequence, block 4212. It is to be appreciated by limiting any rounding error to a single sample, resolved within one packet of each repeating sequence of packets, keeps the end-user from perceiving any ill-effects from this truncation. In contrast, conventional methods which merely address the issue by rounding all of the packets within the repeating sequence to the nearest integer will begin to drop significant bytes of content as the error propagates through the audio conversion process.

While converting the audio stream to a repeating sequence of non-uniform audio packets serve to localize error propagation, it makes the process of supporting predictable, random seeks into the converted packet stream more difficult. More particularly, it is often important to maintain the packets in sequence order when the audio content is seeked (i.e., to facilitate certain filter graph processing such as, for example audio mixing, etc.). One solution to this problem of maintaining an accurate sequence of non-uniform packets in response to a seek query is provided below, with reference to FIG. 43.

FIG. 43 illustrates a flow chart of an example method for facilitating predictable, random seeks into the repeating sequence of non-uniform packets of the converted audio stream is presented, according to one example implementation of the present invention. For ease of illustration, and not limitation, the method of FIG. 43 will be developed with reference to the example converted audio stream 4106 of FIG. 41. In accordance with the illustrated example implementation of FIG. 43, upon receiving a random seek request for audio content, audio conversion object 4000 selectively invokes an instance of random seek function 4012, block 4302.

In block 4304, random seek function 4012 determines which packet is being seeked into based on the frame rate and the seek time (e.g., the project time location within the converted audio content). Assume, for purposes of illustration, that random seek function 4012 receives a request to seek to timeline time of 12.9 seconds. Recall in our example of FIG. 41 that the conversion object 4000 is converting the received audio content received at 10,000 samples per second to 3 packets per second. Thus, random seek function 4012 determines that given the seek time of 12.9 seconds, and the number of packets per sample, that the user has seeked into the third packet of the repeating three packet sequence, i.e., packet 4112.

Once the seeked packet (e.g., 4112) is identified, random seek function 4012 determines how many samples were sent at the end of the prior packet (P), block 4306. In addition, random seek function 4012 determines how many samples should have been sent at the end of the seeked packet (S), block 4308. Random seek function 4012 then calculates the current packet size by subtracting (P) from (S). Thus, with reference to our illustrated example of FIG. 41, random seek function calculates the current packet size by subtracting the samples sent at the end of the prior packet (6,666) from the samples sent at the end of the seeked packet (10,000), block 4310, i.e., 3,334 samples. According to the rounding localization scheme employed in the illustrated example, where the first N−1 samples are truncated to a whole number packet size, with the rounding error (of 1 sample) added to the $N^{th}$ sample, random seek function identifies that the current packet (of 3,334 samples) must be the last packet in the sample.

Given the current packet size and the location (of the packet) within the sample, random seek function 4012 instructs packet generation function on the size of subsequent samples, block 4312.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A method comprising:
   identifying a sample rate of received audio content;
   receiving a conversion sample rate; and
   converting the received audio content to the received conversion sample rate utilizing a repeating sequence of packets where all but one of the packets of each sequence are truncated to a whole number of samples, while the remaining packet is rounded up to the next whole number of samples if the conversion fails to resolve packet size to a whole number.

2. A method according to claim 1, further comprising:
   calculating a conversion packet size by dividing the sample rate of the audio source by the conversion sample rate.

3. A method according to claim 1, wherein converting the audio content to a repeating sequence of non-uniform packets localizes rounding error to each of the repeating sequence of packets.

4. A method according to claim 1, wherein the conversion sample rate is provided by a user of a media processing system exposing an audio conversion object implementing the method.

5. A method according to claim 1, wherein the conversion sample rate may be any rational number.

6. A method according to claim 1, further comprising:
   receiving a request to seek to a particular location within the converted audio content; and
   locating which packet is being seeked into and where, within the repeating sequence of non-uniform packets, the packet lies to maintain the repeating sequence from the seeked packet.

7. A method according to claim 6, wherein the received request denotes a project time within the converted audio content to seek to.

8. A method according to claim 6, wherein locating the packet comprises:
   identifying the project time being seeked to, and the converted sample rate of the sequence of audio packets; and
   determining which of the repeating packets within the sequence has been seeked to based, at least in part, on the project time and the converted sample rate of the sequence of audio packets.

9. A method according to claim 6, wherein determining the size of the packet seeked comprises:
   determining how many samples were sent at the end of a prior packet (P);
   determining how many samples should have been sent by the end of the seeked packet (S); and
   calculating a difference of S and P, wherein the difference between S and P provides the size of the seeked packet.

10. A storage medium comprising a plurality of executable instructions which, when executed implement a method according to claim 1.

11. A computing system comprising:
    a storage medium having stored therein a plurality of executable instructions; and
    an execution unit, coupled to the storage medium, to execute at least a subset of the plurality of executable instructions to implement a method according to claim 1.

12. An audio conversion object comprising:
    a buffer to receive audio content; and
    a packet generator, coupled to the buffer, to convert the received audio content from a first sample rate to a second sample rate, wherein any rounding error incurred in the conversion is localized to within a repeating sequence of non-uniform packets.

13. An audio conversion object according to claim 12, wherein the packet generator localizes any rounding error by generating a repeating sequence of non-uniform packets, wherein all but one packet of the sequence is truncated to a whole sample packet size, while the one packet of the sequence is rounded up to the next whole sample packet size.

14. An audio conversion object according to claim 13, wherein localizing any rounding error to each of the repeating sequence of packets eliminates propagation of an accumulated error beyond the sequence, reducing performance degradation incurred as a result of such accumulated error.

15. An audio conversion object according to claim 13, wherein the packet generator calculates a conversion packet size and, if the conversion packet size does not resolve to a whole number, implements the repeating sequence of non-uniform packets to contain rounding error to within each sequence of packets.

16. An audio conversion object according to claim 15, wherein the conversion packet size is a quotient of the first sample rate divided by the second sample rate.

17. An audio conversion object according to claim 16, wherein packet generator truncates a remainder from the quotient for all but one packet in the repeating sequence, and adds a sample to the one packet to generate the repeating sequence of non-uniform packets.

18. An audio conversion object according to claim 12, further comprising:

a seek function, to facilitate a predictable, random seek to any packet within a repeating sequence of non-uniform packets, while maintaining proper sequence order.

19. An audio conversion object according to claim 18, wherein the seek function is selectively invoked upon receiving a random seek request for audio content.

20. An audio conversion object according to claim 19, wherein the random seek request includes an indication of project time to seek to.

21. An audio conversion object according to claim 20, wherein the seek function identifies a point in the audio content that has been seeked to based, at least in part, on the denoted project time and the second sample rate.

22. An audio conversion object according to claim 20, wherein the seek function calculates a packet size by subtracting a number of samples sent prior to the seeked packet from a number of samples that will have been sent by an end of the seeked packet.

23. An audio conversion object according to claim 22, wherein given the size of the seeked packet and the location of the packet within the repeating sequence, seek function instructs packet generator as to the size of the seeked packet and the proper sequence to issue subsequent packets in the repeating sequence of non-uniform packets.

* * * * *